(12) United States Patent
Krein et al.

(10) Patent No.: US 9,799,779 B2
(45) Date of Patent: Oct. 24, 2017

(54) SYSTEMS AND METHODS FOR PHOTOVOLTAIC STRING PROTECTION

(71) Applicant: The Board of Trustees of the University of Illinois, Urbana, IL (US)

(72) Inventors: Philip T. Krein, Champaign, IL (US); Katherine A. Kim, Urbana, IL (US); Robert C. N. Pilawa-Podgurski, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 285 days.

(21) Appl. No.: 14/475,985

(22) Filed: Sep. 3, 2014

(65) Prior Publication Data
US 2015/0131187 A1   May 14, 2015

Related U.S. Application Data

(60) Provisional application No. 61/901,828, filed on Nov. 8, 2013.

(51) Int. Cl.
| | |
|---|---|
| *H02H 7/00* | (2006.01) |
| *H01L 31/02* | (2006.01) |
| *H02S 50/00* | (2014.01) |
| *H02S 50/10* | (2014.01) |

(52) U.S. Cl.
CPC ........ *H01L 31/02021* (2013.01); *H02S 50/00* (2013.01); *H02S 50/10* (2014.12); *Y02E 10/50* (2013.01)

(58) Field of Classification Search
USPC .......................................................... 361/18
See application file for complete search history.

(56) References Cited

U.S. PATENT DOCUMENTS

| | | | |
|---|---|---|---|
| 7,888,592 B2 | 2/2011 | Lasich | |
| 8,283,558 B2 | 10/2012 | Kukulka | |
| 8,837,098 B2 * | 9/2014 | Victor | H01L 31/02021 361/42 |

(Continued)

FOREIGN PATENT DOCUMENTS

| | | | | |
|---|---|---|---|---|
| BE | EP 2587334 A1 * | 5/2013 | ....... | H01L 31/02021 |
| JP | 2013157457 | 8/2013 | | |

OTHER PUBLICATIONS

Katherine A. Kim and Philip T. Krein. Photovoltaic hot spot analysis for cells with various reverse-bias characteristics through electrical and thermal simulation. Proc. IEEE Workshop Control Modeling Power Electron., pp. 1-8, Jun. 2013.

(Continued)

*Primary Examiner* — Ronald W Leja
(74) *Attorney, Agent, or Firm* — Klintworth & Rozenblat IP LLP

(57) ABSTRACT

A system and method includes a circuit for protecting a photovoltaic string. A bypass switch connects in parallel to the photovoltaic string and a hot spot protection switch connects in series with the photovoltaic string. A first control signal controls opening and closing of the bypass switch and a second control signal controls opening and closing of the hot spot protection switch. Upon detection of a hot spot condition the first control signal closes the bypass switch and after the bypass switch is closed the second control signal opens the hot spot protection switch.

19 Claims, 32 Drawing Sheets

(56) References Cited

U.S. PATENT DOCUMENTS

| | | | |
|---|---|---|---|
| 8,929,038 B2* | 1/2015 | Strobl | H02H 1/0015 |
| | | | 361/42 |
| 9,000,615 B2* | 4/2015 | Robbins | H01L 31/02021 |
| | | | 307/116 |
| 2011/0242865 A1 | 10/2011 | Robbins | |
| 2011/0301772 A1* | 12/2011 | Zuercher | H01L 31/02021 |
| | | | 700/293 |
| 2012/0044014 A1* | 2/2012 | Stratakos | H02J 3/383 |
| | | | 327/530 |
| 2012/0163048 A1* | 6/2012 | Victor | H02H 3/16 |
| | | | 363/55 |
| 2012/0194003 A1 | 8/2012 | Schmidt et al. | |
| 2013/0058140 A1* | 3/2013 | Victor | H01L 31/02021 |
| | | | 363/56.01 |
| 2013/0200710 A1 | 8/2013 | Robbins | |
| 2013/0221753 A1* | 8/2013 | Perreault | G05F 1/571 |
| | | | 307/77 |
| 2014/0003093 A1* | 1/2014 | Song | H02M 7/483 |
| | | | 363/13 |
| 2015/0131187 A1* | 5/2015 | Krein | H02S 50/00 |
| | | | 361/67 |

OTHER PUBLICATIONS

Katherine A. Kim and Philip T. Krein. Hot spotting and second breakdown effects on reverse I-V characteristics for mono-crystalline Si photovoltaics. Proc. IEEE Energy Conversion Congr. Expo., pp. 1007-1014, Sep. 2013.

Texas Instruments datasheet for SM74611 Smart Bypass Diode.

Lee Goldberg, Active Bypass Diodes Improve Solar Panel Efficiency and Performance, Electronic Products—http://www.digikey.com/us/en/techzone/energy-harvesting/resources/articles/active-bypass-diodes-improve-solar-panel-efficiency.html.

* cited by examiner (a) Current vs Voltage (b) Capacitance vs Voltage (a) Current vs Voltage (b) Capacitance vs Voltage (a) string current vs. voltage (b) 50 Hz impedance vs. string voltage (a) front (b) back (a) bypassed (b) protected from hot spotting

SYSTEMS AND METHODS FOR PHOTOVOLTAIC STRING PROTECTION

CROSS-REFERENCE TO RELATED APPLICATION

This application claims the benefit of U.S. Provisional Application Ser. No. 61/901,828, filed Nov. 8, 2013, which is incorporated in its entirety herein.

GOVERNMENT LICENSE RIGHTS

This invention was made with government support under contract number DE-AR0000217 awarded by the U.S. Department of Energy. The government has certain rights in the invention.

BACKGROUND

Photovoltaic (PV) cells are used to generate electrical power by converting solar radiation into direct current electricity using semiconductors that exhibit the photovoltaic effect. Photovoltaic power generation can employ solar panels composed of a number of solar cells containing a photovoltaic material. Solar photovoltaics power generation has been seen as a clean sustainable energy technology which draws upon the planet's most plentiful and widely distributed renewable energy source, the sun. The direct conversion of sunlight to electricity can occur without any moving parts or environmental emissions during operation.

BRIEF DESCRIPTION OF THE DRAWINGS

In association with the following detailed description, reference is made to the accompanying drawings, where like numerals in different figures can refer to the same element.

DETAILED DESCRIPTION

Hot spotting can be a problem that occurs when there is mismatch in the electrical characteristics of series connected photovoltaic cells. The mismatch can be caused by partial shading, uneven degradation of the photovoltaic cells, etc. Under certain conditions, one or more cells can become reversed-based and sink power rather than providing power, which can develop into small regions of higher temperature, called hot spots. Over time, this elevated temperature can lead to accelerated degradation of the photovoltaic cells. A bypass diode attempts to avoid hot spots, but hot spots still have the potential to form. A way to ensure that hot spots will not form is to open-circuit the panel or substring so that no current flows through the series string of photovoltaic cells. This does not sacrifice energy production since in conventional implementations power production from the cell or substring is lost when the diode initiates bypass. The systems and methods provide the bypass function to allow a current path around a compromised photovoltaic string and protects against hot spotting by opening the string.

System, methods and/or devices are described to provide components that can replace or enhance the bypass diode used in the junction boxes of a photovoltaic panel. Rather than bypassing the photovoltaic string through a diode, the component can provide a path around the string that allows the panel, or cell substring, to be open-circuited in order to prevent the photovoltaic cells from hot spotting. Accurate sensing of hot spot conditions can be combined with the switching action and protection. Additionally or alternatively, the switching sequence can protect against arc faults as well as hot spots. Additionally or alternatively, the protection can be combined with a differential power processing (DPP) converter.

Figure 1:
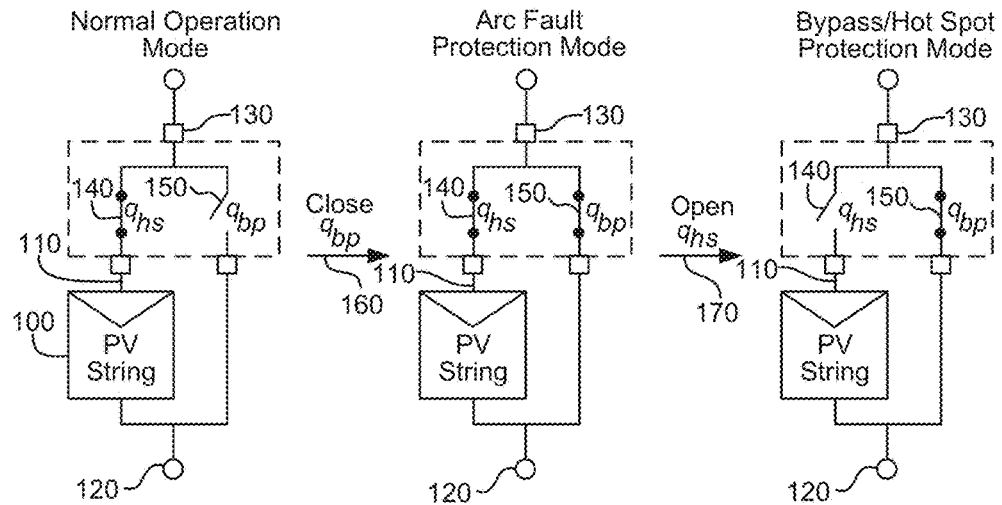
FIG. 1 is a block diagram of an exemplary basic operation for normal and bypass/protection modes.

FIG. 1 is a block diagram of an exemplary basic operation for normal and bypass/protection modes for a string or substring 100 of photovoltaic cells. The component, e.g., an integrated circuit (IC), has three terminals: one to the positive side 110 of the photovoltaic (PV) string, also referred to as a solar cell string, one to the negative side 120 of the PV string, and one to the negative side of the adjacent 130 PV string. Under normal operation, the hot spot prevention switch $q_{hs}$ 140 is closed and the bypass switch $q_{bp}$ 150 is open. The hot spot prevention switch $q_{hs}$ 140 and the bypass switch $q_{bp}$ 150 can be implemented with semiconductors, e.g., metal-oxide field effect transistor (MOSFETS), or other switches including mechanical relays. When bypass is required, $q_{bp}$ closes (160) to halt and protect against arc faults. Then, $q_{hs}$ opens (170) in order to prevent the current from flowing through the PV string 100 to protect the PV cell from hot spotting and the current flows through the bypass switch $q_{bp}$ 150. The transition from normal to bypass mode can take about a second or less. Since hot spots occur over a longer time scale in the order of minutes, hot spot formation is not a concern in the arc fault protection mode during the transition.

Hot spotting is a condition in which a shaded or damaged photovoltaic (PV) cell is forced to conduct reverse current by other cells in series with it. The reverse current can have substantial voltage drop, which can lead to enough power loss to damage the reversed cell. Local heating can also lead to phenomena analogous to second breakdown in transistors, causing current to crowd into a small channel, leading to heat-based local failure of the cell. Providing a reverse bypass diode around a set of cells to carry the reverse current when needed is done on sets of cells rather than individual cells because of cost and reliability issues. It is not always certain that diodes over strings of cells can prevent hot spotting since reverse characteristics of solar cells are not well controlled. The addition of the hot spot prevention switch $q_{hs}$ 140 and the bypass switch $q_{bp}$ 150 provide an alternative at the substring or panel level that can prevent hot spotting under all conditions independent of cell reverse characteristics.

Additionally, bypass diodes are not generally effective against arc faults, in which a local connection problem, insulation wear, or defect results in the substantial voltage present in a PV system driving the formation and continuation of an electrical arc. Since PV panels deliver energy whenever they are exposed to light, an arc fault that forms during the day may continue for many hours, leading to damage or even structural fire. The hot spot prevention switch $q_{hs}$ 140 and the bypass switch $q_{bp}$ 150 provide active changes in connections to drop local voltages below levels that can sustain an arc, leading to quick extinction.

The circuit can work by detecting conditions indicative of cell reversal or other problem conditions, as described in more detail below. The local voltage drops when reversal occurs and certain attributes of locally measured impedance changes. Local current can become erratic in predictable ways if arc faults form. Other failures such as broken connections can be sensed with impedance tests. When such a condition is detected, the hot spot prevention switch $q_{hs}$ 140 initially imposes a short circuit on the suspect substring and also forms a current path that allows external current from the rest of the PV system to bypass the suspect section. After a brief delay, e.g., a fraction of a second, the suspect section is opened by the bypass switch $q_{bp}$ 150 while the bypass path is kept in place. This sequence can bring down the local voltage to extinguish any arc, then opens the local problem section to prevent reverse current flow. The sequence can be repeated as necessary.

Even if $q_{hs}$ fails to open, eliminating output from the associated substring, bypass switch $q_{bp}$ is still available to support continued system operation either as an active switch or through its passive body diode. This makes an open-circuit failure of $q_{hs}$ similar to a physical local failure caused by a cell crack or local corrosion. In addition to hot spot prevention, the two-switch device also allows for arc-fault extinguishment capability without any additional hardware. Arc-faults occur when there is a high voltage over a gap or break in the circuit. Voltage that causes arcing is typically the sum of many PV panels in series. If an arc fault is detected, the arc can be extinguished by reducing the voltage. This can be achieved by temporarily shorting the panel or subpanel PV string to extinguish the fault. The two-switch device can simply close both switches if an arc-fault needs to be extinguished. Once the arc-fault is cleared, the device can transition to the bypass and hot spot prevention mode and resume normal operation. If the arc-fault continues to reoccur, a system-level controller can choose to keep the device in arc-fault extinguishment mode until the system can be serviced. Although hot spotting can occur in the PV string when the device is in arc-fault extinguishment mode, preventing a known arc-fault is an immediate concern. Overall, the device adds more control to the PV systems, which allows it to prevent hot spots and extinguish arc-faults at a subpanel level.

Figure 2:
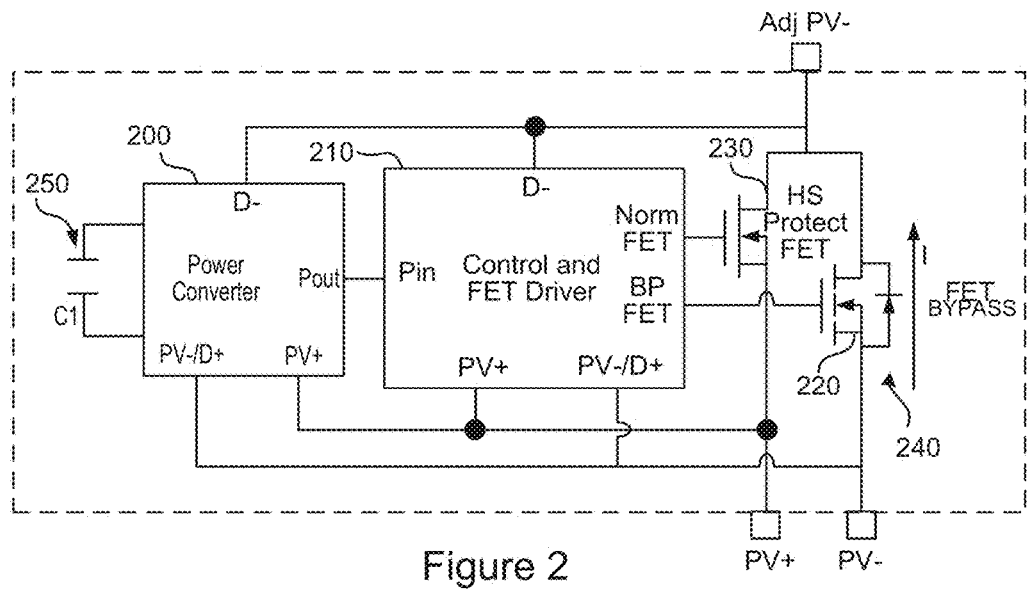
FIG. 2 is a block diagram of exemplary internal connections and sample implementation based on field-effect transistor (FET) devices.

FIG. 2 is a block diagram of exemplary internal connections and sample implementation based on FET devices. Other types of switches can be used. The circuit can include the power converter 200, control and FET driver 210, bypass switch 220, and hot spot protection switch 230. The power converter takes power from either the body diode in the bypass switch 220 or directly from the PV string and provides power to the control and FET driver 210. The control and FET driver 210 takes power from the converter 200, senses the main PV (terminals PV+ and PV−) and the adjacent PV (Adj PV−), and drives switches 220, 230 according to the desired mode. The control and FET driver 210, or other controller e.g., as described herein, can send control signals to the hot spot protection FET 230 and the bypass FET 220 to control opening and closing of the switches. For example, under normal operating conditions the hot spot protection FET 230 is closed and the bypass FET 220 is open. When bypass is required, bypass FET 220 closes to halt and protect against arc faults, then, the hot spot protection FET 230 opens in order to prevent the current from flowing through the PV string to protect the PV cell from hot spotting.

The power converter 200 is sourced by either the voltage drop of the bypass FET body diode 240 or the PV string; the former can be implemented in the same was as was done in the Texas Instrument's SM74611 Smart Bypass Diode using a charge pump as the power converter. Periodically the switch 220 is turned off when power runs out to recharge the capacitor 250, C1. An additional way to power the component is to utilize a small amount of power from the PV string. At low current and power levels, hot spots do not occur in the string. If the PV power is properly utilized, the bypass switch 220 does not have to turn off and back on periodically. The bypass switch 220 can remain on continuously if the PV is able to provide sufficient power.

The control and FET driver block senses the main PV (PV+ and PV−) and the adjacent PV (Adj PV−) voltages, and drives the switches according to the desired mode. The determination about whether or not to bypass is determined based on measurable voltages of the PVs. In one example, if PV+ becomes more negative than PV− then the circuit goes into bypass protection mode. Additionally, if hot spot detection is implemented, the detection circuit can send a signal to the control and FET driver to initiate bypass once hot spotting is detected. Examples of hot spot detection implementations are described below.

The bypass diode 240 can work well as an N-channel MOSFET. The hot spot switch can be a P-channel MOSFET, but at least one switch is driven at all times. A depletion-mode switch can also work as the hot spot switch. Its default mode is closed and is opened by driving the gate. With a depletion-mode device as the hot spot switch 230, both switches are driven only when the module needs to be bypassed.

Figure 3:
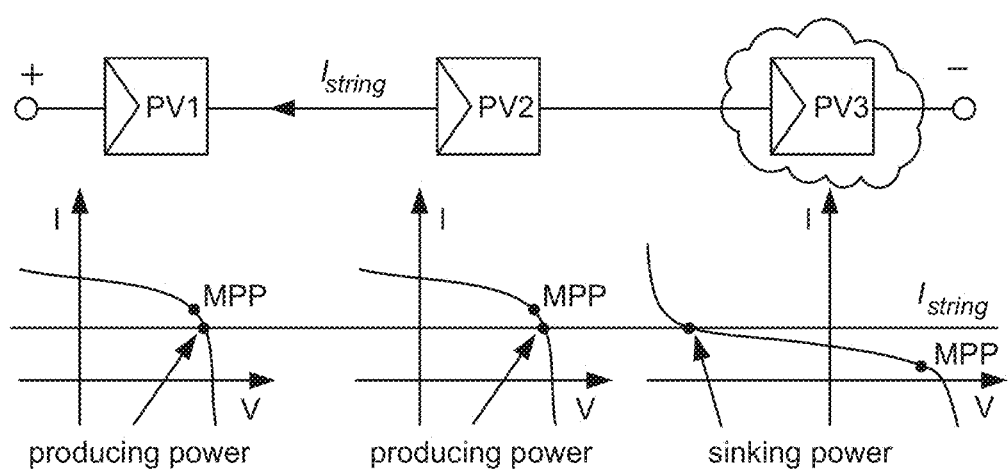
FIG. 3 is a block diagram of an exemplary hot spot condition.

FIG. 3 is a block diagram of an exemplary hot spot condition. An example of a hot spot condition is where PV1 and PV2 are under normal illumination, while PV3 is shaded, e.g., by a cloud. Shading shifts the electrical characteristics down on the current axis such that the maximum power point (MPP) current decreases as illustrated in the I-V plot for PV3. If the string current ($I_{string}$) settles to a greater value than the shaded cell's short-circuit current, its voltage becomes reversed biased. Because voltage is negative but current is flowing, the shaded cell sinks rather than sources power, thus, generating heat. If the cell reaches a significantly high temperature, it forms a hot spot and accelerates cell degradation. Arc-faults in PV systems have gained attention in recent years, particularly because it has been the cause of fires and, thus, raised safety concerns. Arc fault detection circuits often require the use of a high-frequency analog-to-digital converter (ADC). The same hardware may also be utilized to detect hot spotting.

Figure 4:
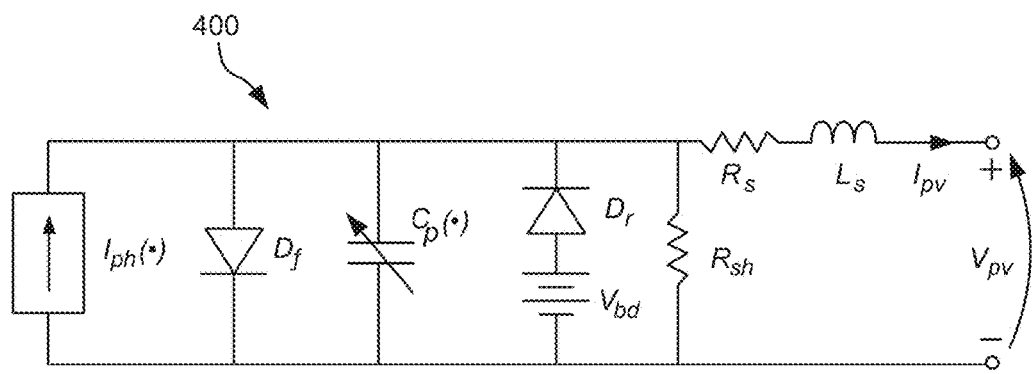
FIG. 4 is a circuit diagram of an exemplary PV cell model that incorporates reverse and dynamic characteristics.

FIG. 4 is a circuit diagram of an exemplary PV cell model 400 that incorporates reverse and dynamic characteristics. This model is developed because existing models lacked the detailed PV characteristics needed to fully understand hot spotting. A common PV model is the single-diode circuit model, which is a nonlinear dc model. There is a variety of more detailed PV models that mainly focus on accuracy for dc characteristics in the forward-biased region. The dynamic and reverse-bias characteristics are commonly neglected, but these characteristics do affect PV operation, e.g., in fault conditions and high-frequency applications. Dynamic characteristics are apparent when PVs are connected to switch-mode power converters and are addressed by this model. PVs exhibit nonlinear parallel capacitance that can be modeled in a similar way to p-n junction diode capacitance.

The dynamic circuit-based PV cell model 400 for both forward and reverse bias incorporates parallel capacitance and series inductance. Model parameters are identified from both datasheet information and measured data. The model is validated with experimental results under dark and illuminated conditions. A PV cell is essentially a p-n junction with parasitic resistances, capacitance, and inductance that can be modeled using circuit components, plus a current source representing photocurrent. In addition to the photocurrent source $I_{ph}(\bullet)$, forward-bias conduction diode $D_f$, shunt resistance $R_{sh}$, and series resistance $R_s$, the model incorporates a series inductance $L_s$, variable parallel capacitance $C_p(\bullet)$, and reverse-bias conducting diode $D_r$ with a breakdown voltage offset $V_{bd}$. This is the large-signal model for a PV cell.

The reverse-biased characteristics are used for accurately emulating a string under mismatch or partial shading conditions, where the shaded cell becomes reverse-biased. When PVs are reversed biased past a determined threshold, the p-n junction goes into reverse breakdown that results in significant reverse current through the cell, and can potentially develop a hot spot. There are some PV models that incorporate reverse breakdown effects, but the parameter identification procedure is not provided. Moreover, a detailed p-n junction diode model incorporating tunneling and avalanche effects requires detailed manufacturing and material data that is not readily available.

Figure 5:
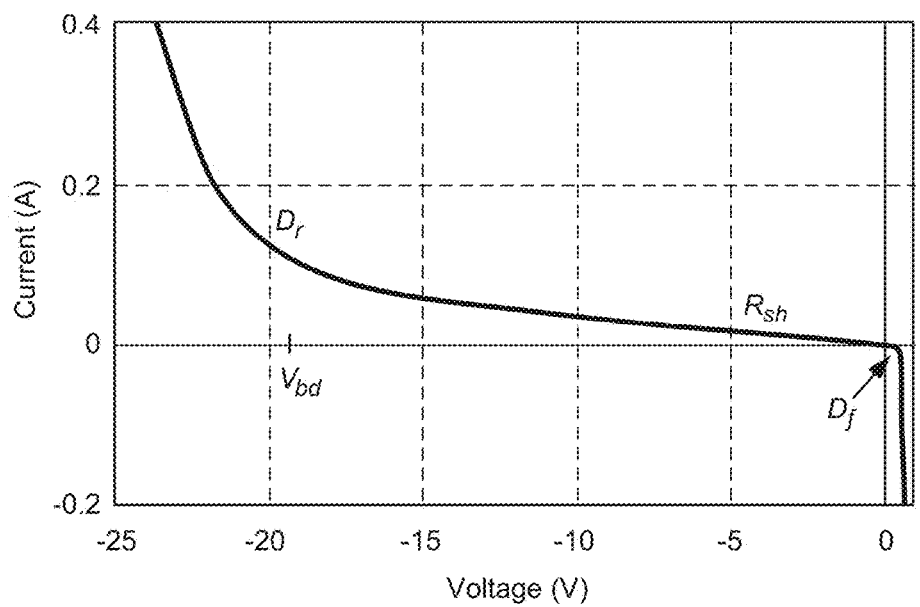
FIG. 5 is an exemplary graph showing the regions where $D_f$, $R_{sh}$, and $D_r$ of the PV cell model of FIG. 4 are most prominent in the I-V curve.

FIG. 5 is an exemplary graph showing the regions where $D_f$, $R_{sh}$, and $D_r$ of the PV cell model 400 of FIG. 4 are most prominent in the I-V curve. Forward diode $D_f$ characteristics dominate under forward voltage bias. Reverse diode $D_r$ characteristics dominate when reverse-biased beyond the breakdown voltage $V_{bd}$, which emulates avalanche and zener breakdown. In between 0 and $V_{bd}$, where neither diode is conducting significant current, resistive characteristics of $R_{sh}$ dominate. Although not explicitly labeled, $R_s$ characteristics are most prominent past the 'knee' of the diode characteristics, e.g., above MPP voltage and below $V_{bd}$.

The model assumes passive components $R_s$, $L_s$, and $R_{sh}$ are constant, e.g., they are not affected by irradiance and temperature changes. The $R_s$ and $L_s$ are associated with the physical length, area, and shape of the leads. These values tend to be small for individual cells, but can be substantially higher for PV panels. Larger $R_s$ leads to higher conduction losses, particularly for cells with higher rated current levels. The $R_{sh}$ value is linked to the PV material, thickness, and manufacturing quality. The parallel capacitance $C_p$ value is not constant. It is affected by the PV operating point. Similarly, the forward diode $D_f$ and reverse diode $D_r$ have nonlinear characteristics that are affected by temperature. PV parallel capacitance $C_p$ comes from the sum of three different sources: junction, diffusion, and breakdown capacitance. These capacitances are nonlinear values that depend on temperature and the operating point.

Figure 6:
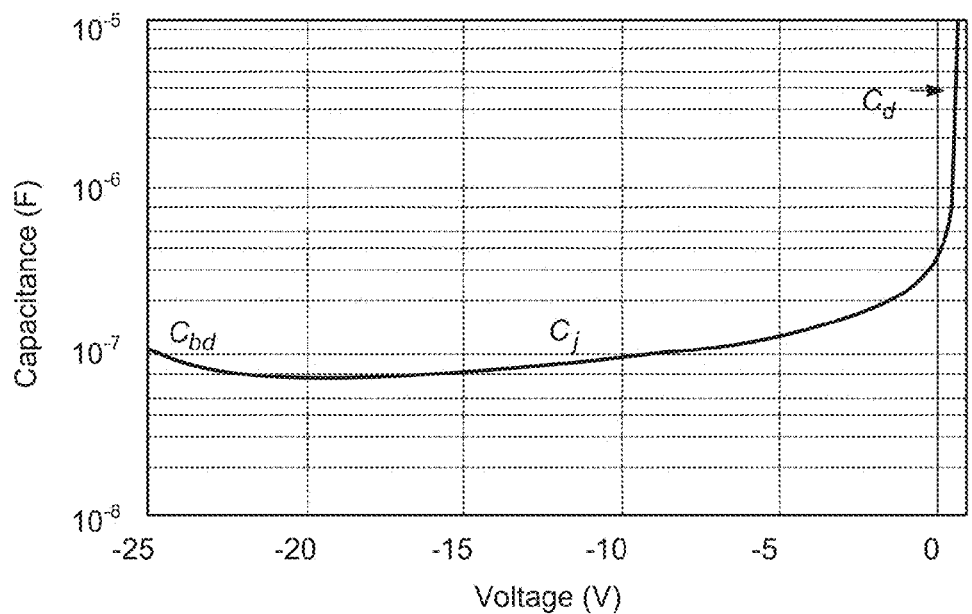
FIG. 6 is an exemplary graph showing $C_p$ as a function of $V_{pv}$ and the regions of the PV cell model of FIG. 4 where each type of capacitance dominates.

FIG. 6 is an exemplary graph showing $C_p$ as a function of $V_{pv}$ and the regions and the regions of the PV cell model of FIG. 4 where each type of capacitance dominates. Junction or transition capacitance $C_j$ comes from charge stored in the depletion region at the semiconductor p-n junction. It dominates at small positive and negative voltages, where the junction is not conducting significant current. Diffusion capacitance $C_d$ comes from the charge stored in the neutral region of the semiconductor outside the depletion region. Thus, it dominates above the maximum power point (MPP) voltage, where the junction carries significant current. The magnitude of $C_d$ tends to be larger than that of $C_j$. It is prominent when the p-n junction is forward biased and negligible when reversed biased. Breakdown capacitance $C_{bd}$ dominates when the cell goes into reverse breakdown. Tunneling, Shockley-Read-Hall recombination, and avalanche are physical factors that contribute to p-n junction breakdown. Since the capacitance changes when voltage becomes negative, the capacitance characteristics can be monitored and used to detect when hot spots occur, e.g., when the capacitance dips below a certain threshold. The capacitance can be one of several factors to detect hot spotting.

Figure 7:
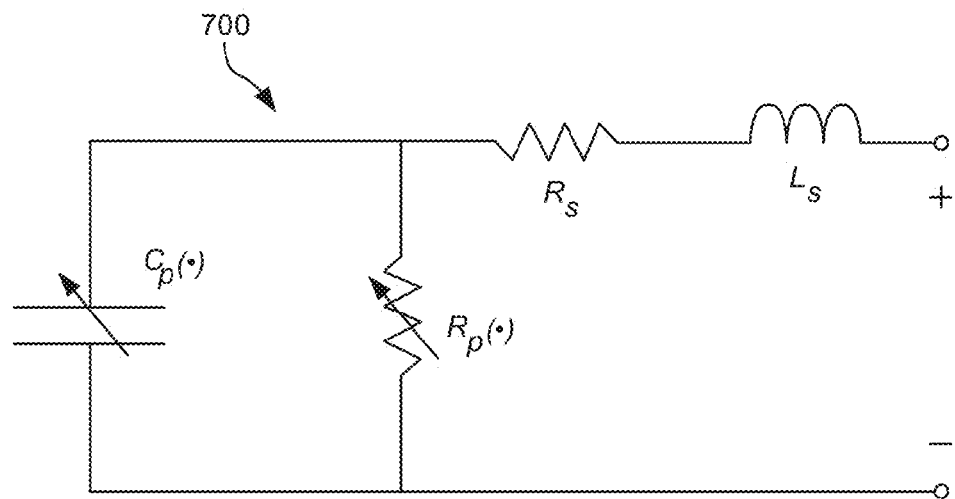
FIG. 7 is a circuit diagram of an exemplary ac small-signal model.

FIG. 7 is a circuit diagram of an exemplary alternating current (ac) small-signal model 700. Under ac analysis the $R_s$, $L_s$, and $C_p(\bullet)$ values are equivalent to the large-signal model described in FIG. 4. The $I_{ph}$, diode characteristics for $D_f$ and $D_r$, and $R_{sh}$ become an equivalent parallel resistance $R_p(\bullet)$, whose impedance depends on G, T, $I_{pv}$, and $V_d$, small-signal impedance Z can expressed mathematically as:

$$Z = \left[ R_s + \frac{R_p}{\alpha + 1} \right] + j\left[ L_s\omega - \frac{\omega R_p^2 C_p}{\alpha + 1} \right] \quad (1)$$

where $\omega = 2\pi f$ is the radian frequency and $\alpha = \omega^2 R_p^2 C_p^2$.

Figure 8:
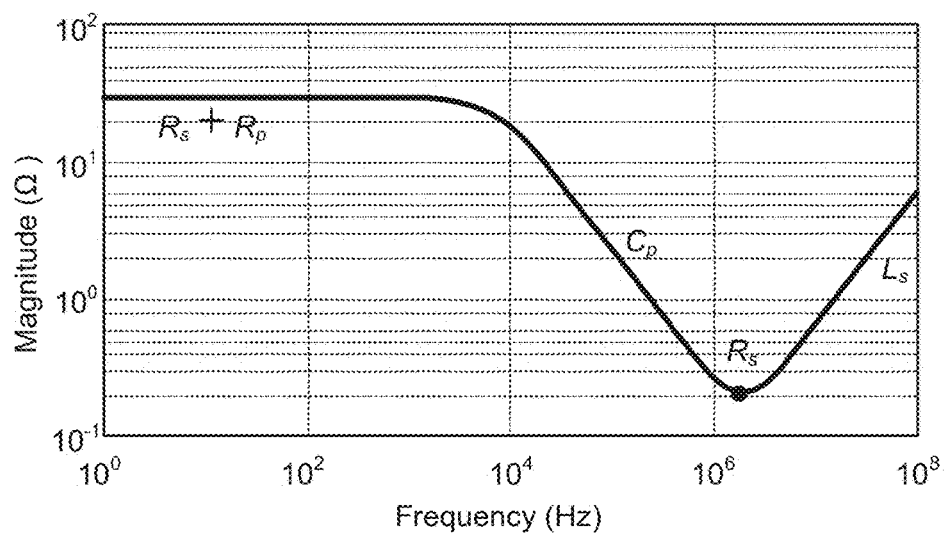
FIG. 8 is a graph showing an example bode plot for the small-signal model and is labelled according to where each component dominates the impedance magnitude.
Figure 8:
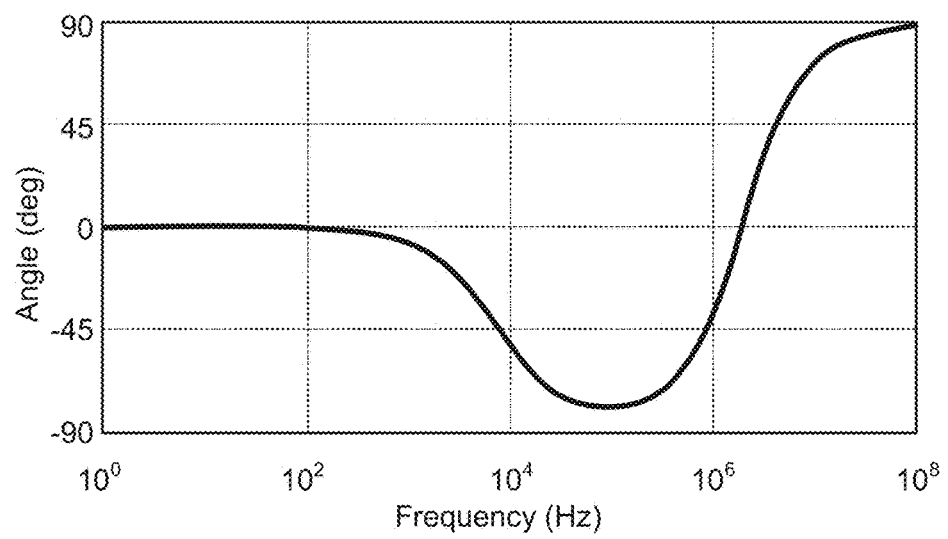

FIG. 8 is a graph showing an example bode plot for the small-signal model and is labelled according to where each component dominates the impedance magnitude. Monitoring the magnitude and angle string impedance can be used to detect when a hot spot is occurring, e.g., a hot spot occurs when the string impedance changes.

Figure 9:
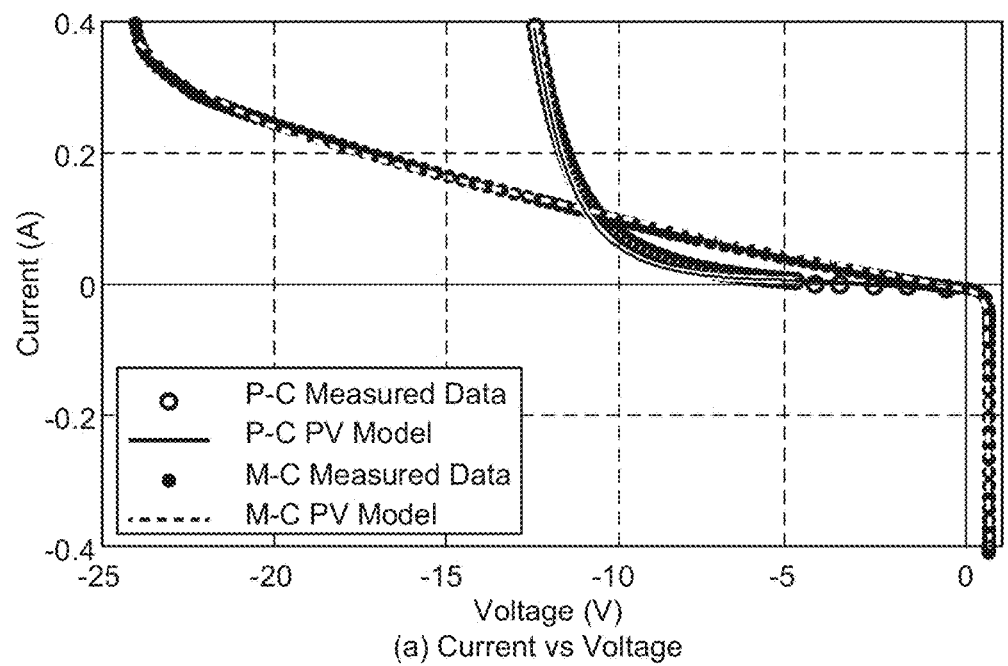
FIGS. 9(a) and (b) are graphs illustrating exemplary I-V curves for the measured data and model or the cells of FIG. 8.
Figure 9:
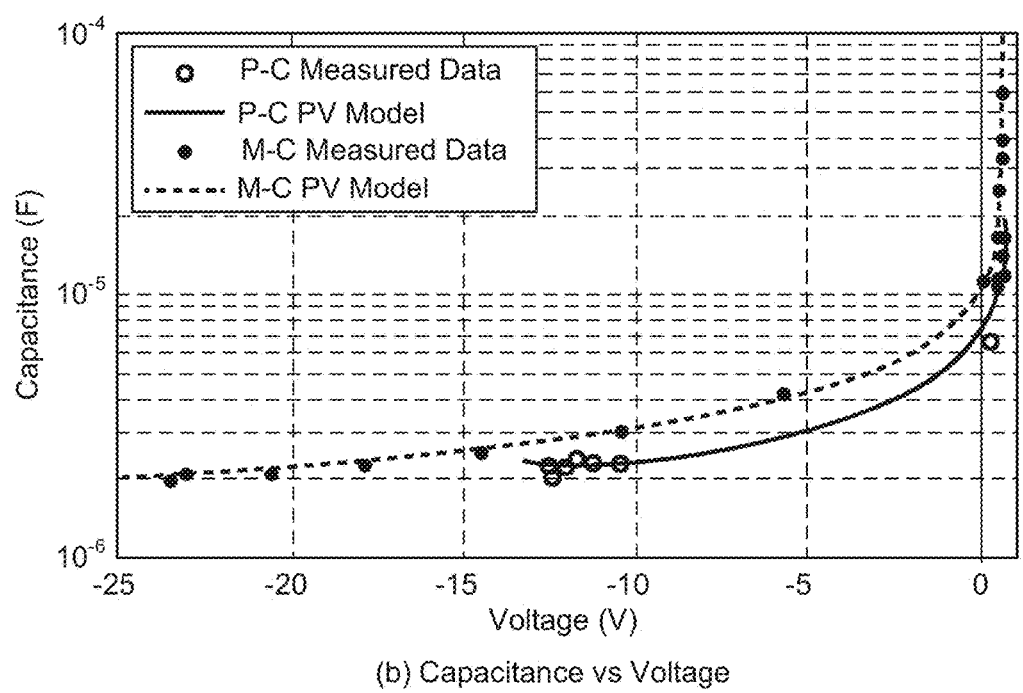

FIGS. 9(a) and (b) are graphs illustrating exemplary I-V curves for the measured data of a mono-crystalline (m-c) and a poly-crystalline (p-c) Si PV cell compared to the model for each cell based on FIG. 8. The model fits well to the data over the full range of operation, with only a slight divergence around the breakdown voltage. The m-c cell has a high $R_{sh}$ and low $V_{bd}$, indicating that the cell exhibits good reverse-blocking characteristics, while the p-c cell shows a lower $R_{sh}$ and lower $V_{bd}$. The measured and modeled current-voltage (C-V) curves are compared in FIG. 9(b). In the m-c cell, capacitance begins to increase due to breakdown capacitance below $V_{bd}$=−12.0. In the p-c cell, the transition and diffusion capacitance trends are clear, but voltage does not become sufficiently reversed biased to observe breakdown capacitance trends.

The p-c cell is tested under an indoor illumination setup using a dc-powered halogen light. The cell is illuminated at 60 W/m2—a relatively low irradiance to reduce temperature increase. The p-c cell model is simulated at the same illumination level.

Figure 10:
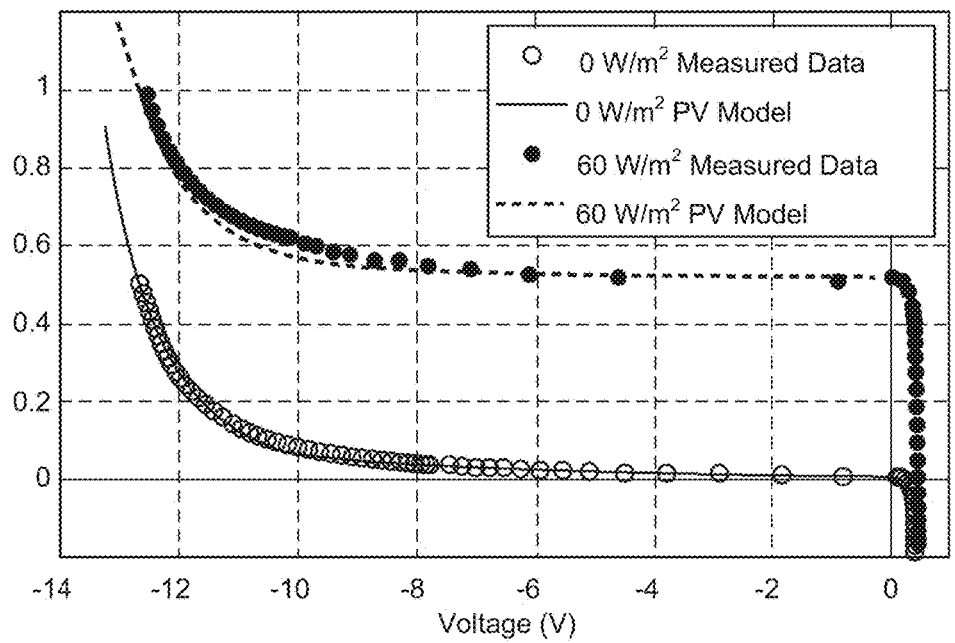
FIGS. 10(a) and (b) are an exemplary graphs comparing the dark and illuminated results.
Figure 10:
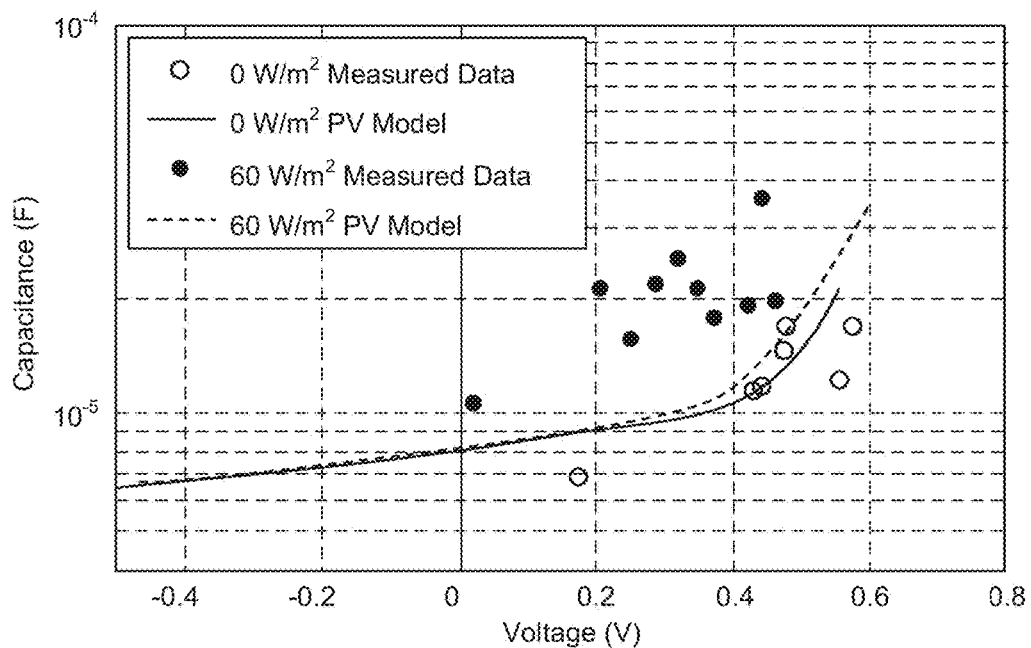

FIGS. 10(a) and (b) are an exemplary graphs comparing the dark and illuminated results.

FIG. 10(a) shows the I-V curve. General characteristics exhibit good matching between model and data. FIG. 10(b) shows the C-V curve in the forward-biased region, where the illumination increases diffusion capacitance. The measured data appears to have a slightly higher increase than predicted by the model, but the general trends are consistent. Therefore, the PV model accurately models the reverse and capacitance characteristics of experimentally measured cells. To further explore hot spotting, the model can be extended to incorporate the effect of power dissipation in the cell on the internal temperature.

Hot spotting conditions within a series-connected string can be detected by observing the impedance characteristics of the string. The ac small-signal PV model and the associated bode plot in FIG. 8 show that each of the equivalent circuit parameters can be measured over a certain frequency range. At low frequencies, the resistance value dominates and the impedance magnitude is $R_s+R_p$. As frequency increases and the impedance magnitude begins to decrease, the $C_p$ value can be measured. The lowest impedance magnitude is the resonance point, where $R_s$ is measured. At frequencies above the resonance point, $L_s$ can be calculated.

Figure 11:
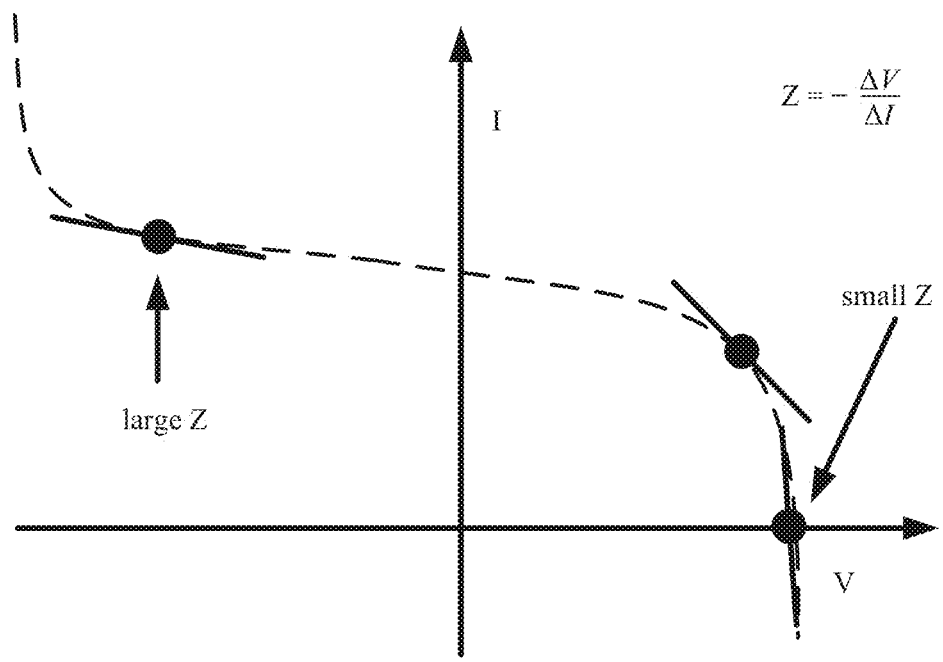
FIG. 11 is a graph illustrating an exemplary PV I-V curve showing the impedance at various operating points at DC based on the slope of the curve.

FIG. 11 is a graph illustrating an exemplary PV I-V curve showing the impedance at various operating points at DC based on the slope of the curve. The $R_s+R_p$ impedance is the impedance at low frequencies, but it can also be measured from the slope of the I-V curve. Its value depends on the PV cell's operating point. Given a small perturbation, the impedance, Z, is the negative change in voltage divided by the change in current. In regions where the slope is steep (reverse breakdown and above the MPP voltage), Z is small. In the middle horizontal region, Z values are large. When $R_s+R_p$ changes, it is visualized on the bode plot as the resistive magnitude regions moving up or down directly with the resistance change. The $C_p$ value of a PV is non-linear with voltage, as shown in FIG. 8. The capacitance is also increases with illumination. On the bode plot in FIG. 8, capacitance changes are visualized as the capacitive magnitude region shifting left and right: left for $C_p$ increase and right for $C_p$ decrease.

Figure 12:
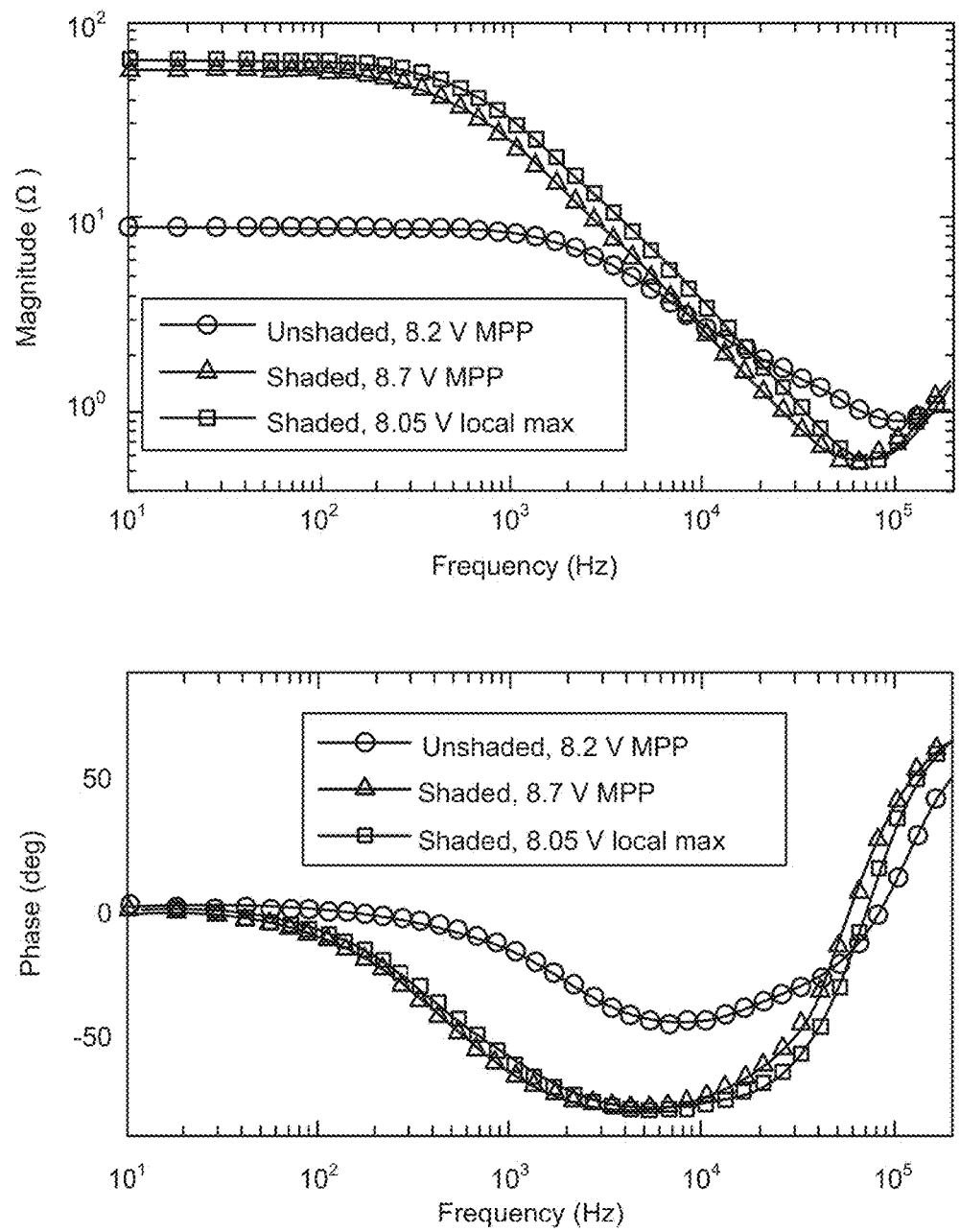
FIG. 12 is graphs of exemplary string impedance plots of unshaded cell MPP and the partially shaded string at the new MPP and a local maximum.

FIG. 12 is graphs of exemplary string impedance plots of unshaded cell MPP and the partially shaded string at the new MPP and a local maximum. In a PV panel, many cells are connected in series and the overall string characteristics are a combination of the individual cell characteristics. Typically, the string is controlled by a power converter that employs a maximum power point tracking (MPPT) algorithm. Some algorithms find the new MPP quickly and other simpler algorithms, such as fractional open-circuit voltage control, maintain a relatively constant voltage throughout operation. Both these types of control are plotted and experimental string characteristics are compared under equally-illuminated and partially-shaded conditions.

Consider a maximum-seeking control algorithm that quickly adjusts to find the new MPP. One drawback of maximum-seeking algorithms is that they sometimes operate at a local maximum rather than the true maximum. Here, the partially shaded string had a true MPP at 8.70 V and a local maximum at 8.05 V. Impedance measurements are taken at both maxima points and compared to the unshaded string measurement, as shown in FIG. 12. At both maxima, there is a significant increase in resistance and a clear capacitance increase compared to the unshaded string. The same results were found when the string is assumed to be under a constant voltage control.

Under both types of MPPT control algorithms, partial shading resulted in a clear resistance increase and capacitance increase. The resistance increase indicates that the shaded cell is in the moderate reversed voltage bias region, which increases the resistance of the overall string characteristics. When the shaded cell become reverse biased, its capacitance decreases. For the rest of the cells, capacitance increases because voltage increases when the string is under MPPT. As a result, an increase in the overall capacitance is observed in the tested PV string. These trends can be used during operation to detect partial shading of a PV string. The string impedance characteristics give an insight into the shading condition of the string. Results showed that partial shading caused string capacitance to increase and resistance to increase. The direction of the resistance and capacitance can change depending on the string length and partial-shading severity.

Since it is determined that monitoring the string parallel capacitance and resistance can indicate hot spotting, explicit detection methods can be developed. The method can monitor the capacitance and resistance values accurately enough to detect a change due to hot spotting. The sensors and hardware can be integrated into a dc-dc converter and the processing requirements can be implementable on a microprocessor or digital signal processor (DSP), etc. Two detection approaches are explored: a mathematical approach using parameter estimation and a frequency-based impedance measurement approach.

Parameter estimation allows the string parallel resistance and capacitance to be constantly measured while the dc-dc converter controlling the PV string operates normally. Two parameter estimation approaches are considered: observer-based and least-squares. Both methods are discussed, simulated, and evaluated for feasibility.

In PV systems, a PV string can be controlled by a dc-dc converter, which can be a buck or boost converter. This converter imposes a small ripple onto the PV. This ripple is used for measuring the PV ac parameters. Around the steady-state operating point, the cell can be modeled as the simplified small-signal model, as in FIG. 7. This model can be the basis for the mathematical model used to develop the parameter estimation methods.

The parallel capacitor voltage can be $v_p$ and the PV current can be $i_{pv}$. The governing equation for the capacitor voltage is:

$$\dot{v}_p = \frac{-1}{R_p C_p} v_p + \frac{-1}{C_p} i_{pv} \qquad (2)$$

which is used as the system equation. Denote $x = v_p$ and let $$a = \frac{1}{R_p C_p} \qquad (3)$$

$$b = \frac{1}{C_p} \qquad (4)$$

Then, the system equation becomes $$\dot{x} = -ax - bi_{pv} \qquad (5)$$

This is used to develop both the observer and least-squares parameter estimation algorithms for $R_p$ and $C_p$.

A Lyapunov-based observer is designed to estimate the capacitor voltage ($v_p$) inside the PV cell, which is not directly measurable. Tuning laws are implemented to estimate the PV parameters, which vary with the operating point. The exact parameter values are guaranteed to converge for a given operating point. After the parameters converge, the tuning laws are turned off and a Luenberger observer is used for $v_p$. After a change in the PV string, the Luenberger observer outputs a non-zero value, indicating a change in state from the previous operating point.

The estimate of $v_p$ is $\hat{x}$, and the estimates of a and b are $\hat{a}$ and $\hat{b}$, respectively. The estimator equation for $\hat{x}$ is $$\dot{\hat{x}} = -a_m(\hat{x}-x) - \hat{a}x - \hat{b}i_{pv} \qquad (6)$$

where $a_m > 0$. We define $e := \hat{x} - x$. Consider the control Lyapunov function $$V(e, \hat{a}, \hat{b}) = \frac{1}{2}\left(e^2 + \frac{(\hat{a}-a)^2}{\gamma 1}\right) + \frac{(\hat{b}-b)^2}{\gamma 2} \qquad (7)$$

where $\gamma_1$ and $\gamma_2$ are positive. Then, using Lyapunov-based design, we derive tuning laws for the estimates $\hat{a}$ and $\hat{b}$ as $$\dot{\hat{a}} = \gamma_1 x e \qquad (8)$$

$$\dot{\hat{b}} = \gamma_2 i_{pv} e \qquad (9)$$

Selecting larger $\gamma_1$ and $\gamma_2$ achives faster convergence.

Figure 13:
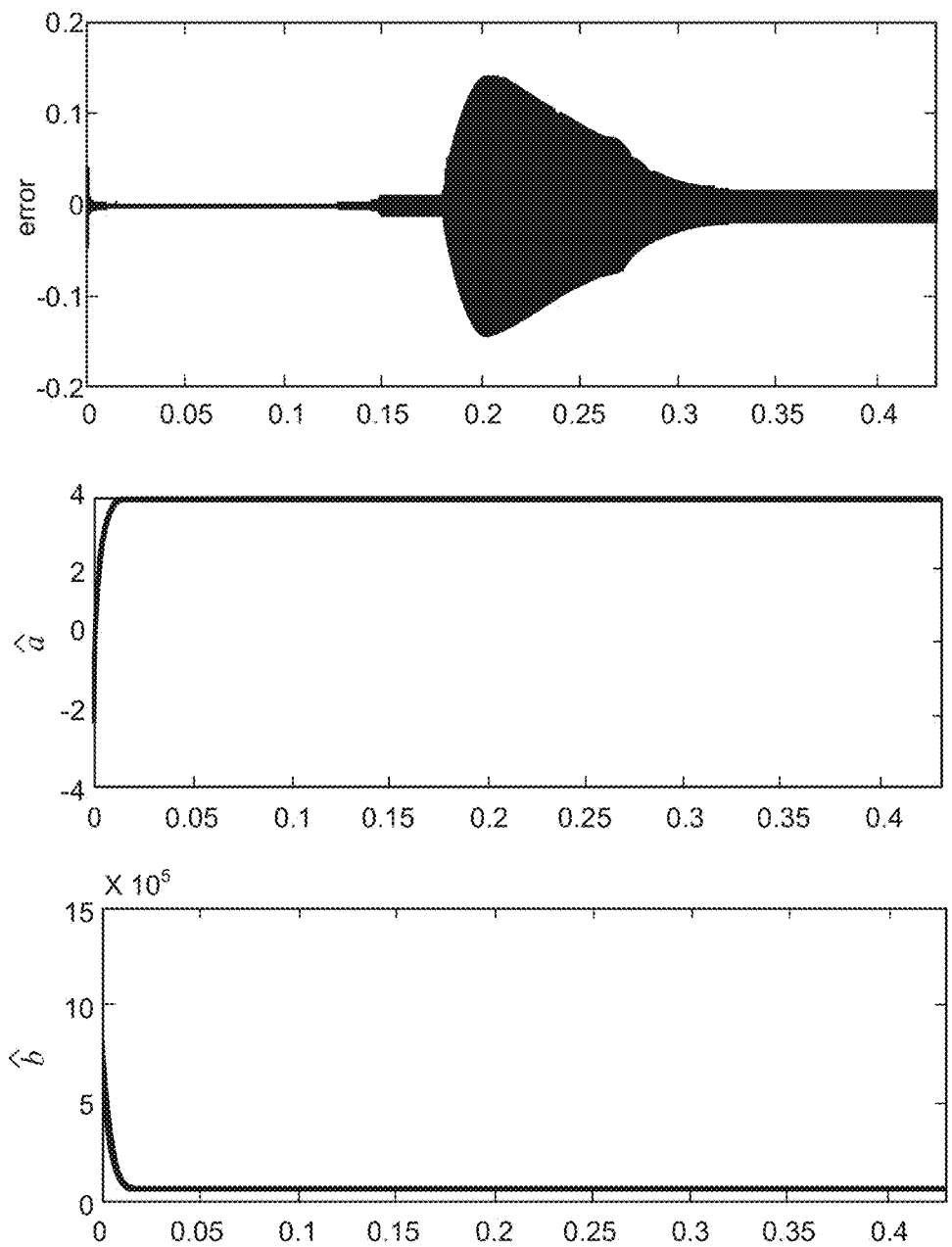
FIG. 13 is a graph illustrating an exemplary residual generator response showing the error and estimates of a and b to determine PV parameters for hot spot detection.

FIG. 13 is a graph illustrating an exemplary residual generator response showing the error and estimates of $\hat{a}$ and $\hat{b}$ to determine PV parameters for hot spot detection. The observer method is implemented and tested in PLECS. FIG. 13 illustrates the error signal e converge to 0, and $\hat{a}$ and $\hat{b}$ converge to their actual values. Once parameters have converged, turn off tuning laws and run the following Luenberger observer for $v_p$:

$$\dot{\hat{x}} = -\bar{a}\hat{x} - \bar{b}i_{pv} + L(x-\hat{x}) \qquad (10)$$

where $\bar{a}$ and $\bar{b}$ are estimates for a and b, respectively, after the tuners are turned off. A change in $R_p$ or $C_p$ results in the parameters a and b to move away from $\bar{a}$ and $\bar{b}$, respectively. As a result, the Luenberger observer will generate a non-zero error signal e. In the simulation results, in FIG. 13, the PV hot spots at time t=0.15 s such that parameters a and b diverge from the estimates and the error signal e grows away from zero. The Luenberger observer is able to detect hot spotting. Normal changes in illumination, temperature and operating point may also result in minor parameter changes and cause the observer to give a non-zero output. This is effective for determining when a change in either parameter occurs, but may not be effective for measuring the magnitude of the change in each parameter, as illumination levels and temperature frequently shift. The observer design can be adjusted for each system. The least-squares approach is also described and it may be easier to implement than the observer design in some embodiments.

The least-squares approach is also considered for $R_p$ and $C_p$ parameter estimation. Using the $v_p$ state equation (5), take $i_{pv}$ as an oscillatory input signal, u. The fact that the model is linear simplifies the estimation problem. Based on parameter estimation theory, the least-squares method gives accurate estimation of the parameters a and b, and, in turn, $R_p$ and $C_p$.

Figure 14:
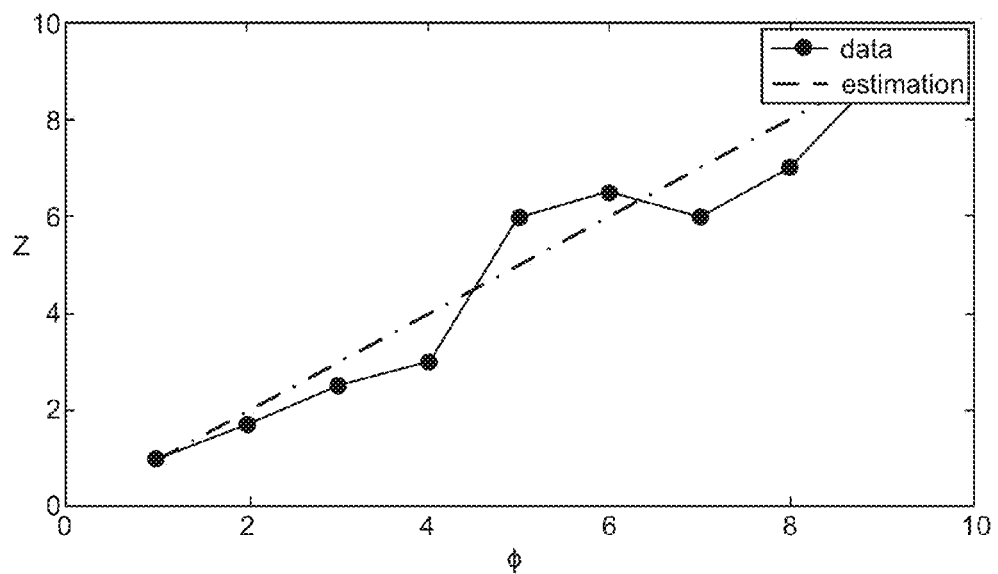
FIG. 14 is a graph of exemplary parameters for a least-squares method.

FIG. 14 is a graph of exemplary parameters for a least-squares method. Parameter estimates are updated at every instance such that the estimated output of the system $\dot{x}$ is driven closer to the measured one in the sense of least squares. In order to realize this, the state space model in (5) is put into linear parametric form. To avoid noise disturbance, a 1st-order stable filter $$\frac{1}{\Lambda(s)}$$

can be used such that the filtered variable is:

$$z(t) = \theta^T(t)\Phi(t) \quad (11)$$

where $$z = \frac{1}{\Lambda(s)}x,$$

parameter vector is $\theta = (b, a)^T$, regressor vector is $$\Phi = \frac{1}{\Lambda(s)}(u, -x)^T$$

and $\Lambda(s) = s + \lambda$. The chosen parameter A is much less than switching frequency of the converter to avoid switching noise.

The linear parameterization can be graphically represented as a set of points in the $(z, \Phi)$ plane, in FIG. 14. The least-squares method is used to find the line that best fits the data points by finding its slope $\theta$. The slope is found by minimizing the sum of the squared distances between data points and the best-fit line. Thus, an objective is to minimize an integral error cost $$J(\hat{\theta}) = \frac{1}{2}\int_0^t \left(\hat{\theta}^T(t)\Phi(s) - z(s)\right)^2 ds \quad (12)$$

The continuous-time recursive least-squares algorithm with respect to the cost given in (12) is $$\dot{\hat{\theta}} = -Pe\Phi \quad (13)$$

$$\dot{P} = -P\Phi\Phi^T P \quad (14)$$

$$P(0) = Q_0 = Q_0^T > 0 \quad (15)$$

If the input signal $i_{pv}$ is measured accurately enough, both parameters are correctly estimated, e.g., the estimator obtains enough information from the output ripple to ensure convergence of the parameters to their actual values. The concept of persistent excitation implies that if the input is a sufficiently rich signal, then the estimated parameters converge to the real values. The oscillatory ripple signal that is imposed on the PV by the converter during normal operation acts as the rich input signal for accurate parameter estimation.

Figure 15:
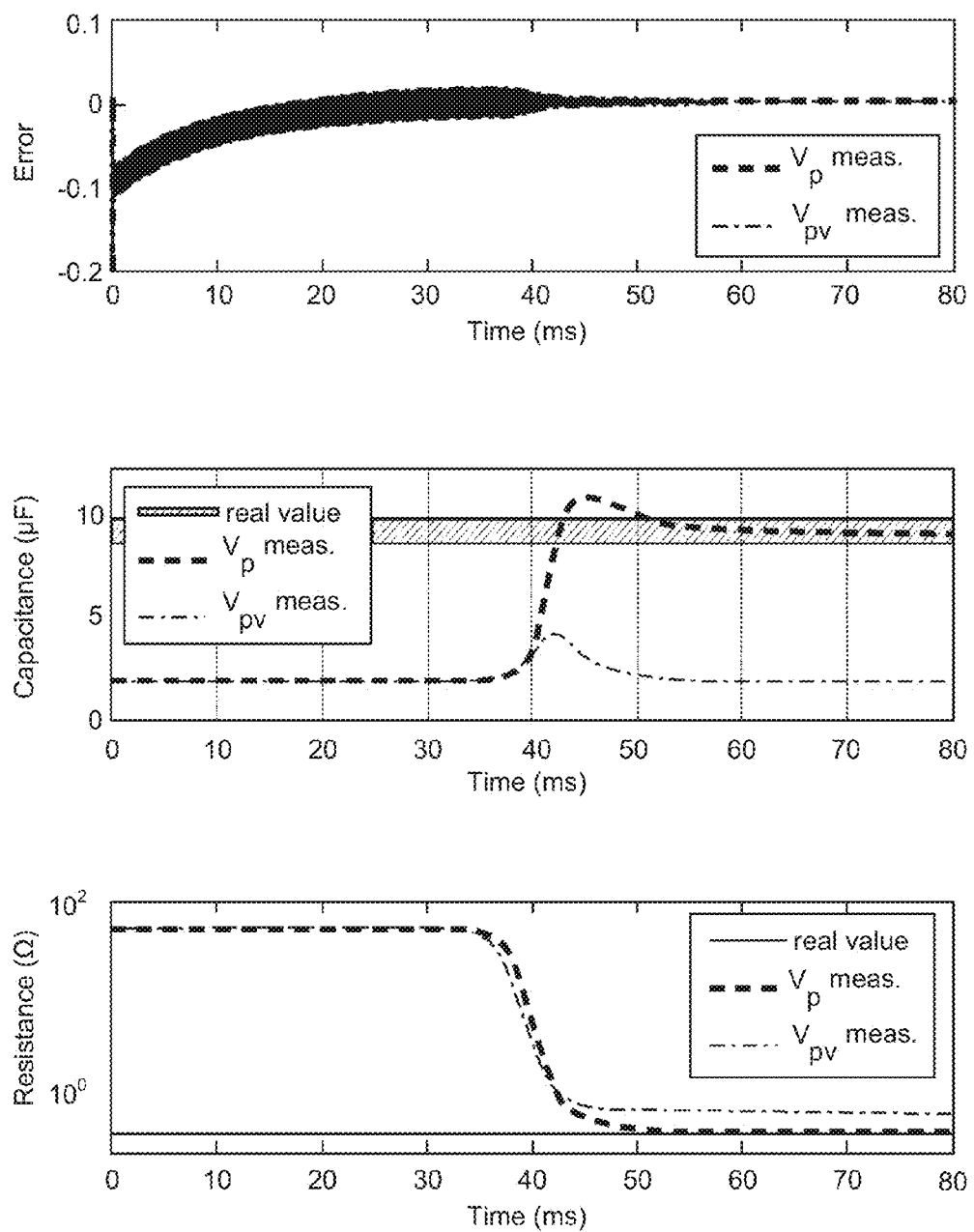
FIG. 15 are graphs of exemplary simulated results for the error, $C_p$ and $R_p$ using the least-squares parameter estimation method.

FIG. 15 are graphs of exemplary simulated results for the error, $C_p$ and $R_p$ using the least-squares parameter estimation method. A least-squares parameter estimation algorithm can be implemented in PLECS and Matlab Simulink on a modeled PV string, e.g., the models described above. When $v_p$ and $i_p$ are read directly, the error signal converges to zero and both parameters converge to the correct values, in FIG. 15. The least-squares approach are accurate when the internal voltage $v_p$ is a readable signal. However, $v_p$ is an internal state that cannot be measured directly; PV voltage $v_{pv}$ is the only measurable voltage.

The difference between $v_p$ and $v_{pv}$ is determined by $R_s$ ($L_s$ is negligible at most converter switching frequencies). $R_s$ tends to be small such that $v_p$ and $v_{pv}$ are similar values. Initially, it is assumed that $v_p \approx v_{pv}$ and signals $v_{pv}$ and $i_{pv}$ are fed into the least-squares parameter estimator; results are in FIG. 15. The error signal converges to zero and the $R_p$ estimate is near-accurate, but the $C_p$ estimate is highly inaccurate. The real value is 9.1 uF and the estimate is 2.0 uF—a significant error of −79%. This shows that the $R_s$ value cannot be completely ignored. Its value can be estimated to determine $v_p$.

The parallel voltage equivalent $v_p^*$ can be represented as:

$$v_p^* = v_{pv} - i_{pv}R_s \quad (16)$$

The $R_s$ value is found a priori to accurately estimate $v_p$. Accurate estimation of $v_p$ results in accurate estimation of the parameters $C_p$ and $R_p$, which can be an ideal situation. At minimum, the detection algorithm is able to detect significant changes in the parameters when the PV shifts from normal operation to hot spotting. Even if the estimation does not give the true value, a change in $C_p$ or $R_s$ results in a proportional change in the estimate to accurately detect a hot spot condition.

Measuring $R_s$ may not be completely accurate because it tends to be a small value that is difficult to measure precisely. Also, $R_s$ may vary with temperature. The accuracy of $R_s$ is explored through simulation. A set of simulations are conducted where $v_p$ is estimated using (16) with in $R_s$ value at various accuracies, ranging from −75% error to 50% error. The least-squares estimator is allowed to converge and, then, a hot spot is induced such that $R_p$ and $C_p$ both change and the estimator converges to new estimate values. The term proportionality factor is the estimated value divided by the real value. A proportionality factor of 1 means the change is exactly proportional and negative means the estimate changes in the opposite direction of the real value change. Table 1 outlines the effect of the $R_s$ measurement error on the parameter estimate errors and the proportionality factor of the change. To stay within 50% parameter error and greater than 0.5 proportionality factor, $R_s$ error should not exceed ±25%.

TABLE 1

| $R_S$ error | $C_P$ error | $C_P$ Prop. Fac. | $R_P$ error | $R_P$ Prop. Fac. |
|---|---|---|---|---|
| −75% | −65.1% | −0.04 | 36.5% | 0.55 |
| −50% | −52.6% | −.24 | 20.7% | 0.68 |
| −25% | −33.0% | 0.59 | 7.2% | 0.84 |
| 0% | −0.9% | 0.99 | −1.5% | 1.01 |
| 25% | 49.5% | 1.38 | −3.5% | 0.93 |
| 50% | 105.1% | 1.50 | 110.3% | −0.58% |

Figure 16:
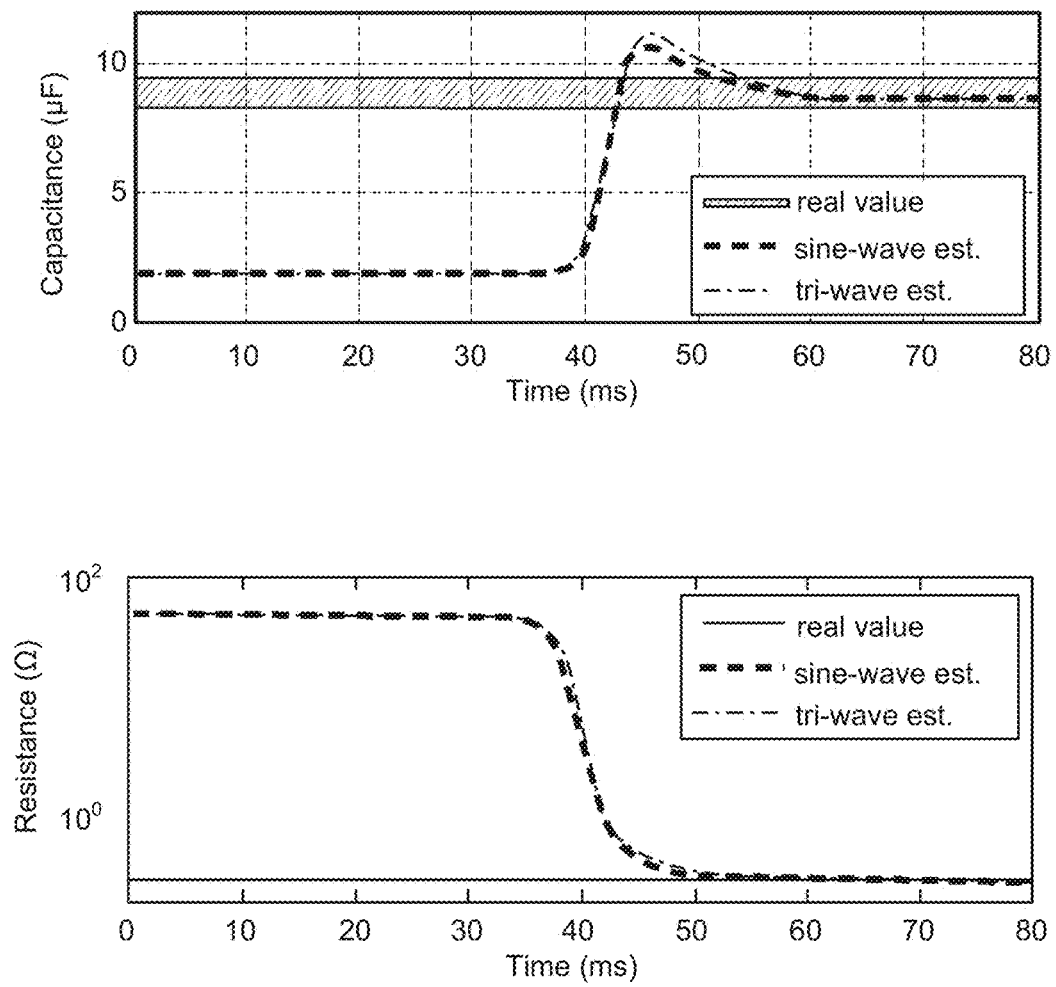
FIG. 16 is a graph of an exemplary estimation of $C_P$ and $R_P$ with sine and triangle wave input.

FIG. 16 is a graph of an exemplary estimation of $C_P$ and $R_P$ with sine and triangle wave input. The input current signal into the PV depends on the dc-dc converter input filtering characteristics. If there is significant filtering, the signal may be more sinusoidal; if there is little filtering, the signal be more triangular in nature. To ensure that both waveform types are adequately rich signals, a sine and triangle wave at 50 kHz are used as inputs in the simulation (it is assumed that $R_s$ is known accurately). The convergence results are in FIG. 16. Although the triangle wave takes slightly longer to converge to the correct values, the difference is minor. This shows that both signals are sufficiently rich for accurate parameter estimation.

The least-squares method requires a relatively high sampling rate to converge to accurate estimates. It can be noticed in simulation that if the step-size is too large, the parameters converged to a value offset from the real one. In implementation, high-frequency analog-to-digital converters (ADCs) can be used to measure both the $v_{pv}$ and $i_{pv}$ signals. High-frequency ADCs are more expensive and the high sampling rate uses more processing power and may require more expensive processor.

Estimators for PV parameters $R_p$ and $C_p$ are developed using an observer-based and least-squares approach. The observer parameter estimator detects parameter value changes, but the hot spot condition may not be easily distinguished from changes in illumination or temperature. The least-squares approach can also effectively estimate parameters and is easier to design, but one challenge is that $v_p$ is properly estimated. If the $R_s$ measurement has less than ±25% error, the estimates is within 50% accuracy and proportional to the real values. Least-squares estimation is effective for both sine and triangle wave inputs, such that it works with most converter input filters. The higher cost of high-frequency ADCs and heavier computation requirements of these parameter estimation techniques may be acceptable based on an implementation.

Figure 17:
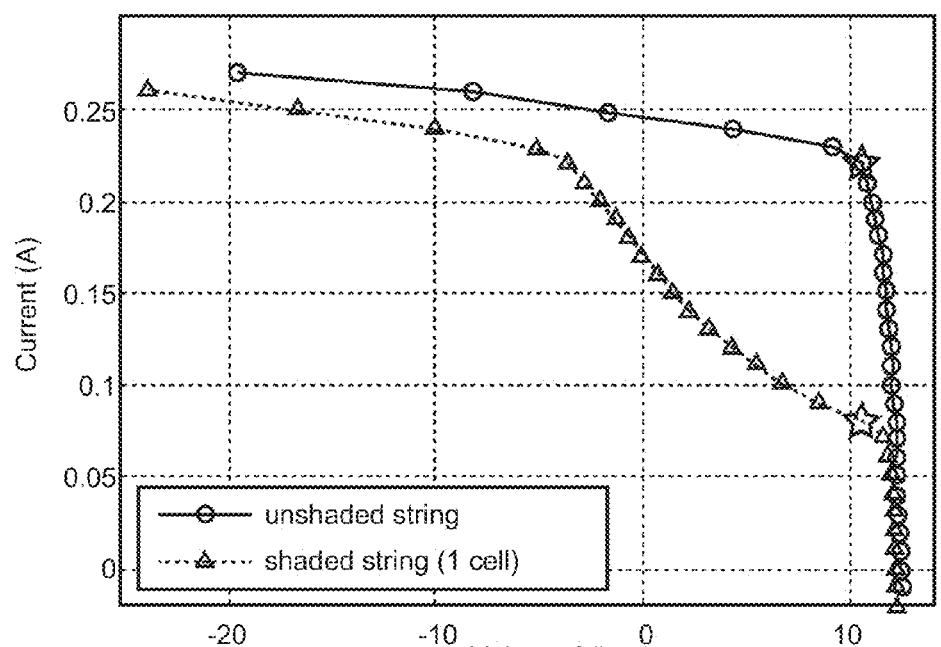
FIG. 17 are exemplary graphs of (a) I-V curve measurements and (b) impedance at 50 Hz for a frequency-based impedance measurement approach for a 24-cell string unshaded at 500 W/m² and then with one cell shaded.
Figure 17:
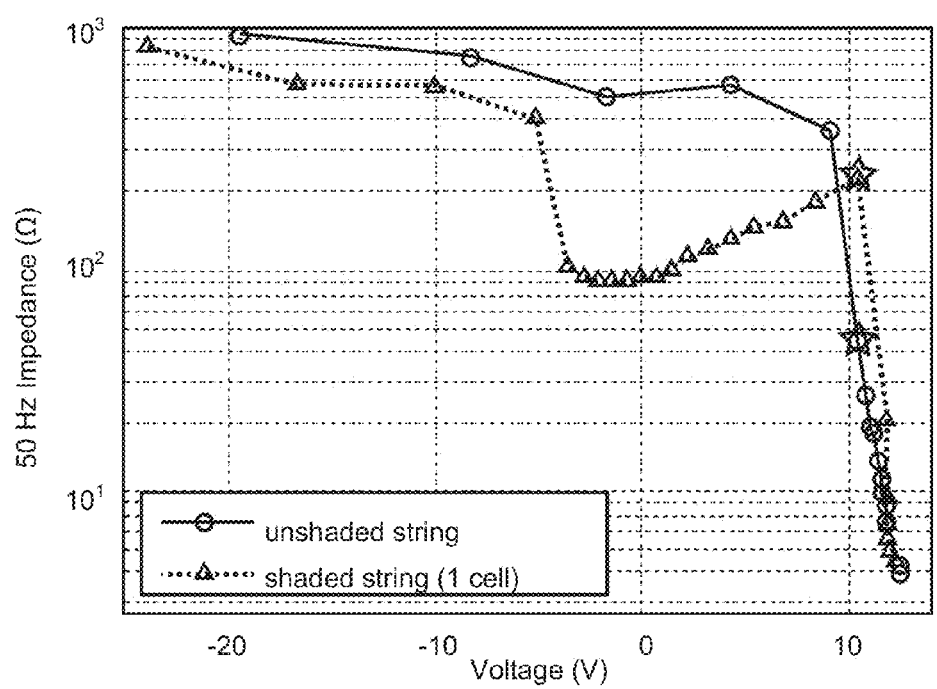

FIG. 17 are exemplary graphs of (a) I-V curve measurements and (b) impedance at 50 Hz for a frequency-based impedance measurement approach for a 24-cell string unshaded at 500 W/m² and then with one cell shaded. The hot spot detection approach is to measure ac impedance of the PV string over a range of frequencies during operation to determine the $R_p$ and $C_p$ values. A number of frequency values can be periodically swept to measure the $R_p$ and $C_p$ values and monitor any major changes in their value to detect hot spotting. Measuring both magnitude and phase requires more time and computing power. Both impedance calculation time and power are be minimized to make the solution more viable. Measuring only magnitude can be sufficient to detect the PV impedance change that occurs during a hot spot condition. For the initial method, only impedance magnitude is measured to reduce computing requirements. A second consideration is the number and range of frequency measurements. Many measurements over a wide sweep of frequencies helps visualize the bode plot, but it also requires more time and processing power. A smaller set of frequency measurements may be sufficient to detect the expected change. Two frequency measurements can be considered, one to measure each parallel component. However, a wider sweep of more than two points may help draw the overall trends more clearly.

A low frequency below 100 Hz can be used to detect the equivalent resistive ($R_s + R_p$) value of the string. A higher frequency between 10-70 kHz can be used to detect the equivalent capacitance of the tested PV string. The ability to detect the resistance and capacitance values with an impedance measurement at one low and one high frequency of 50 Hz and 50 kHz, respectively, is determined. In this example, a string of 24 m-c Si cells are strung in series to represent a typical substring within a panel. At each frequency, the impedance value is measured over the operating voltage range. An automated test is designed using the HP 33120A function generator to create the ac signal, Keithley 2420 to create dc offset, and Tektronix MSO4034 oscilloscope to measure and record the output signals. The illumination level is 500 W/m².

The string's I-V curve is in FIG. 17(a) and the 50 Hz impedance measurements are in FIG. 17(b) for the unshaded and shaded cases. The MPP for each case is marked with a star. The impedance value correlates well with the slope of the I-V curve. If either a MPPT or constant voltage control is implemented, there is a clear increase in the equivalent resistance when the cell becomes partially shaded, which is consistent with the earlier experimental results. If the string operates at any voltage lower than the MPP voltage, an impedance increase is observed for this string. If the shaded cell has severe reverse-breakdown characteristics, the impedance value can stay the same or decrease. Understanding the reverse characteristics of the individual cells can inform the expected equivalent resistance change during partial shading.

Figure 18:
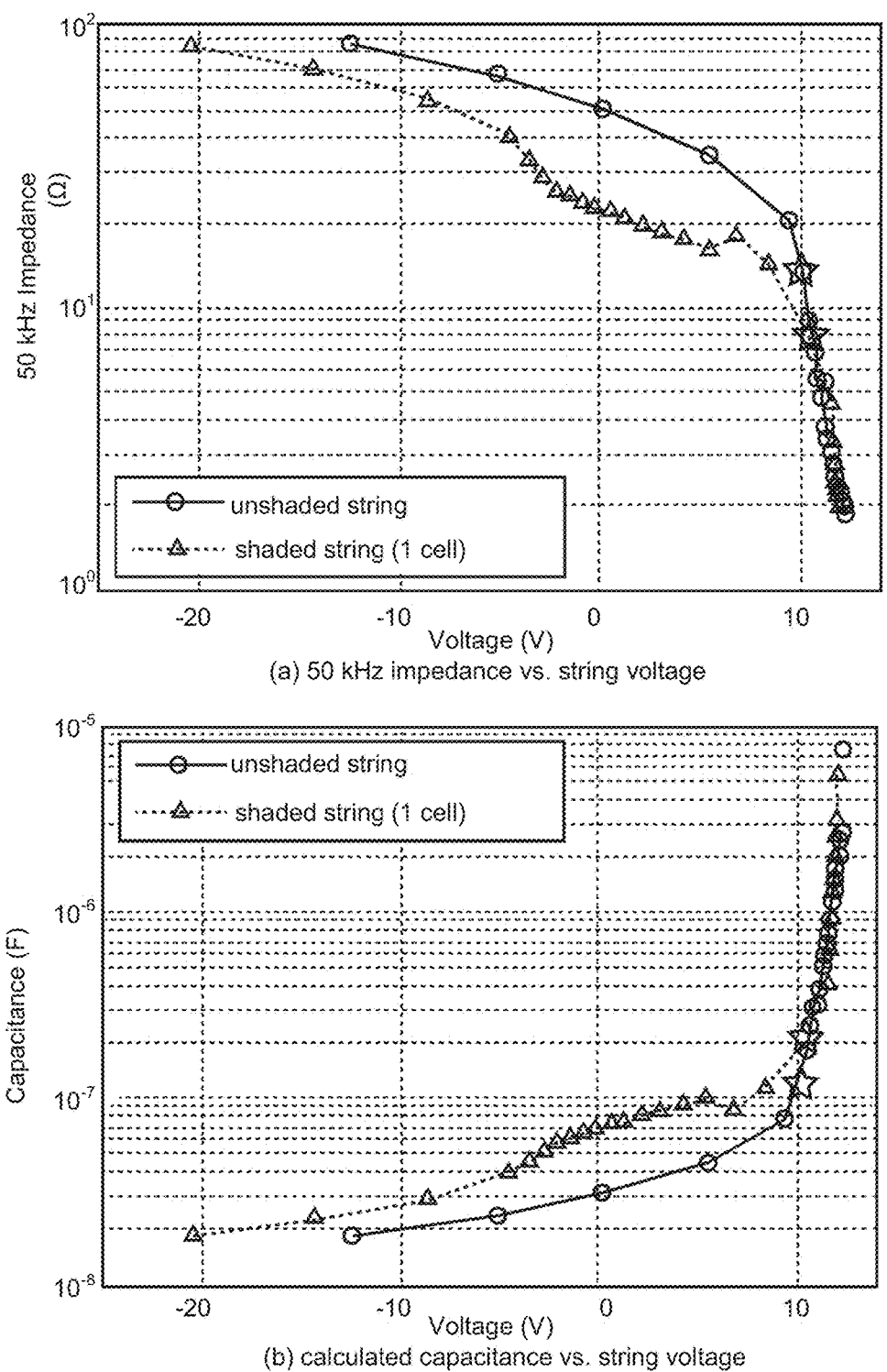
FIG. 18 is an exemplary graph of (a) impedance measurements at 50 kHz and (b) calculated capacitance for a 24-cell string unshaded at 500 W/m² and then with one cell shaded.

FIG. 18 is an exemplary graph of (a) impedance measurements at 50 kHz and (b) calculated capacitance for a 24-cell string unshaded at 500 W/m² and then with one cell shaded. A telling indication of partial shading is the high-frequency impedance measurement, which is linked to capacitance. The string's 50 kHz impedance measurement is in FIG. 18(a) along with the calculated capacitance value in FIG. 18(b) for the unshaded and shaded conditions. The MPP of each condition is marked with a star. There is a clear impedance decrease and capacitance increase for voltages at and below the MPP. If operation is maintained at the MPP, the capacitance increases from 0.12 μF to 0.21 μF due hot spotting. Capacitance increase is a consistent indicator of a hot spotting PV string.

Figure 19:
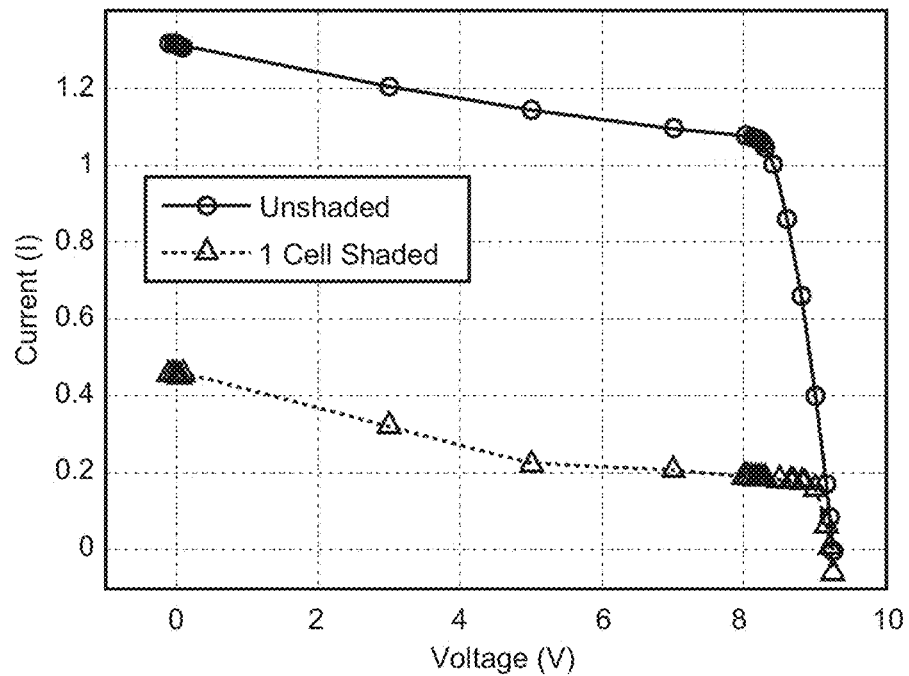
FIG. 19 is a graph illustrating exemplary unshaded and shaded solar cell string I-V characteristics for resistance estimation.

FIG. 19 is a graph illustrating exemplary unshaded and shaded solar cell string I-V characteristics for resistance estimation. A slope of the I-V curve at the operating point is equivalent to the dc impedance value ($R_s + R_p$) for detecting hot spotting. Some MPPT algorithms, such as perturb and observe (P&O), continue to take small steps above and below the MPP under steady-state operation. The dc resistance at the operating point can be estimated from the measured I-V points around the MPP. This is tested on the PV string under unshaded and shaded conditions. The dc resistance values are measured and compared to the value estimated from the I-V curve. At each operating point, the current and voltage is measured above and below the point by a small voltage step: 0.05 V for the points near and above the MPP and 0.1 V for lower voltage points. The impedance value is calculated from the linear slope from those two points. Table 2 compares the measured and estimated dc resistance value for both the unshaded and partially shaded string conditions. The overall error magnitude ranges from 1% to 34%; error magnitude tends to be lower for lower resistance values and higher for higher resistance values. Higher resolution of the current measurement can decrease this error. These results confirm that a control method that enables the measurement of the I-V characteristics around the operating point can fairly accurately estimate the dc resistance, particularly at or above the MPP. Between unshaded and shaded cell the resistance increases on the I-V curve to indicate hot spotting.

TABLE 2

| String Condition | Voltage (V) | $R_S + R_P$ Meas. (Ω) | I-V Curve Estimate (Ω) | Error (%) |
|---|---|---|---|---|
| Unshaded | 9.2 | 0.566 | 0.573 | 1 |
|  | 8.2 | 8.79 | 8.13 | −8 |
|  | 0 | 40.3 | 26.7 | −34 |
| Shaded (1 cell) | 9.2 | 0.769 | 0.812 | 5 |
|  | 8.7 | 56.8 | 47.6 | −16 |
|  | 8.2 | 63.8 | 69.0 | 8 |
|  | 8.1 | 63.5 | 45.5 | −28 |
|  | 0 | 23.3 | 25.4 | 9 |

The capacitance and resistance values can be estimated fairly well using only two frequency measurements. A signal at 50 Hz measured the impedance to determine $R_p$, and a signal at 50 kHz is used to determine $C_p$. These frequency values may be adjusted for different string lengths and PV cell types. If a P&O MPPT algorithm is used, the 50 Hz measurement can be replaced with I-V measurements around the operating point to determine $R_p$. This can be a fairly effective method to measure the PV string parameter values without heavy computational and hardware requirements.

The parameter estimation methods can be most effective when the internal vp is measurable. However, this is an internal variable so it is estimated using an observer or calculation based on the cell Rs value. The PV string voltage and current is sampled using a high-frequency ADC and use a more powerful processor. Impedance measurements are also able to calculate the PV string parameter values, potentially, using only two or one frequency measurement. It does not require a high-frequency ADC and its computational requirements are lower than the parameter estimation method. The impedance measurement approach can accurately detect hot spotting with low hardware and computational requirements. Parameter estimation methods may be used for hot spotting detection. Their implementation requirements may be higher than the impedance measurement approach.

Figure 20:
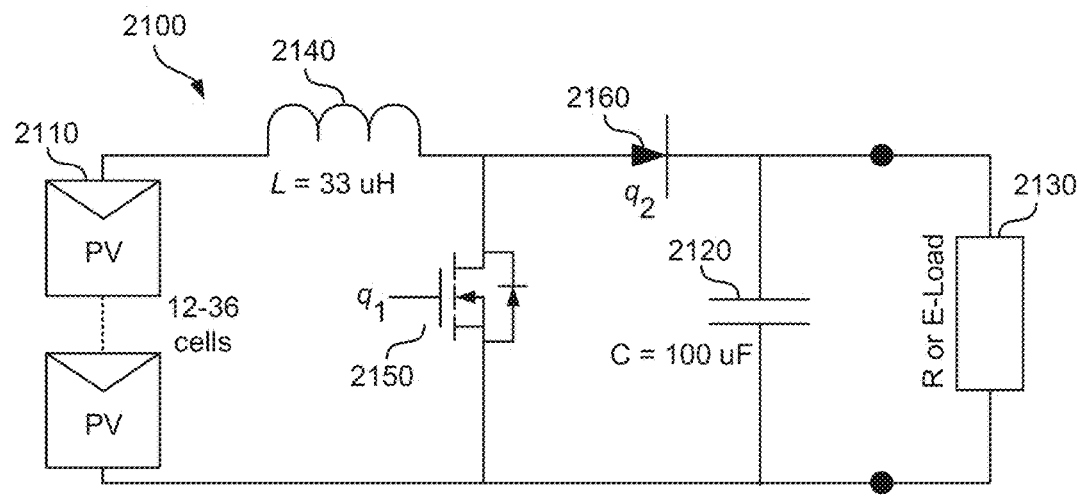
FIG. 20 is an exemplary boost converter schematic 2100 for reading PV impedance for hot spot detection.

FIG. 20 is an exemplary boost converter schematic 2100 for reading PV impedance for hot spot detection. Hot spot detection functionality can be integrated into a dc-dc converter that controls the PV string 2110. A dc-dc converter is designed to control a subpanel PV string and implement impedance-measurement-based hot spot detection. Sensors for the PV voltage and current are used to measure the string impedance; these sensors are typically used for MPPT control, so they are already a part of the dc-dc converter. The control loop and digital controller code for the dc-dc converter can be used. The dc-dc converter design can measure the impedance change of a PV string while implementing MPPT and minimizing 1) additional hardware, 2) calculation time, and 3) computational power. An input of the dc-dc converter connects to the PV string 2110 and a DSP is used as the controller. An integrated solution can be used in place of the controller.

In one example, the dc-dc converter can be designed to connect to a subpanel string 2110 that may range from 12 to 36 Si cells. Si PV cell MPP voltage can be estimated at 0.5 V per cell. Thus, the input voltage specification is 6 V to 20 V. PV string current is proportional to cell area. Many full-size commercial panels are rated up to 8 A, but the current produced depends on illumination level, which varies throughout the day. At very low illumination levels, the chance and severity of hot spotting is low, e.g., hot spot detection is most important for high current levels. Thus, the input current specification is set to 2 A to 8 A. Also, in order to measure the impedance of the PV string, an input capacitor is not used, as it would add additional capacitance to the measurement.

The output accepts the power produced by the PV string and maintains a relatively constant voltage. In one implementation, the sub-panel converters can be connected to an inverter in an individual, cascaded, or parallel configuration. In any configuration, the converter output is generally connected to a large dc link capacitance 2120 that maintains steady voltage. The output can either be an electronic load 2130 in constant-voltage mode or a resistive load with parallel capacitance sufficiently large to maintain a low output ripple. An exemplary maximum output ripple specification is 0.2 V under normal operation. To accurately read the PV string impedance, the dc-dc converter is able to generate a controlled oscillatory waveform for either the current or voltage of the PV. A boost converter has the inductor 2140 on the input side of the converter, which allows for current control at the input. Thus, the boost converter is chosen for its simplicity and input current controllability. The controlled switch is $q_1$ 2150 and the second switch $q_2$ 2160 can include a passive Schottky diode for simplicity. If efficiency is a prime concern, a synchronous converter can also be implemented by changing the diode 2160 into an actively controlled switch.

A switching frequency of 250 kHz is chosen that implemented duty ratio dithering for PV string input. Target ripple on the input current is below 0.5 A, thus an inductance of 33 μH is chosen. An output capacitance of 100 μF is chosen to maintain an output voltage fairly constant. Exemplary boost converter specifications and chosen component values are detailed in Table 3.

TABLE 3

| Topology | Boost |
| --- | --- |
| Input Voltage | 6-20 V |
| Input Current | 2-8 A |
| Input Current ripple | ≤500 mA |
| Inductor | 33 μH |
| Output voltage ripple | ≤0.5 V |
| Output resistor | 10 Ω |
| Output capacitance | 100 |

To measure impedance at the converter input, the voltage and current is accurately measured. Voltage measurement can be achieved using a voltage divider at the input. The sum of the voltage sense resistors is significantly higher than the PV parallel resistance, which is generally below 500Ω. A resistor sum of more than 500 kΩ can be sufficient. There are a variety of ways to measure current. An accurate method is a series sense resistor where an amplifier is used to measure the resulting voltage drop across the resistor. One potential drawback is that this results in exponential power loss with current. The sense resistor and a small sense resistor of 0.01Ω is used to reduce power loss. Both voltage and current sensor inputs are connected to ADC pins of the controller.

The controller is able to generate a controllable pulse-width modulation (PWM) signal to control the converter, quickly and accurately read the voltage and current measurements, and calculate the impedance value. A DSP is an appropriate controller. This application includes one PWM output pin that can operate at a fundamental frequency of 250 kHz and two ADC inputs with high resolution.

To accurately measure the PV impedance, multiple frequencies can be measured. This is a challenge in dc-dc converters, where the switching frequency is usually set to one value. Multiple frequencies can be measured by modulating the duty ratio at the desired frequency such that the average value is maintained at the desired value for MPPT. The general control strategy can operate as follows: 1) run MPPT algorithm to determine appropriate duty ratio for MPP operation; 2) after a set time interval, initialize the impedance measurement; 3) take the last duty ratio determined by the MPPT algorithm as the mean of the perturbation wave; 4) generate an oscillatory perturbation wave in the duty ratio at the first frequency value; 5) measure the PV current and voltage waveforms; and calculate and record the impedance magnitude according to:

$$Z = \left| \frac{\Delta I}{\Delta V} \right| \quad (17)$$

Repeat 4 and 5 for all frequency values.

Based on present and previous impedance measurements, determine if hot spotting is occurring. Take appropriate action or return to step 1 until the impedance measurement begins again. In order to implement this control strategy, a number of design choices can be made, including: impedance measurement time interval, perturbation waveform shape and magnitude, frequency values in the measurement set, procedure to calculate impedance, hot spotting condition identification procedure, and appropriate action to take under hot spotting condition.

Figure 21:
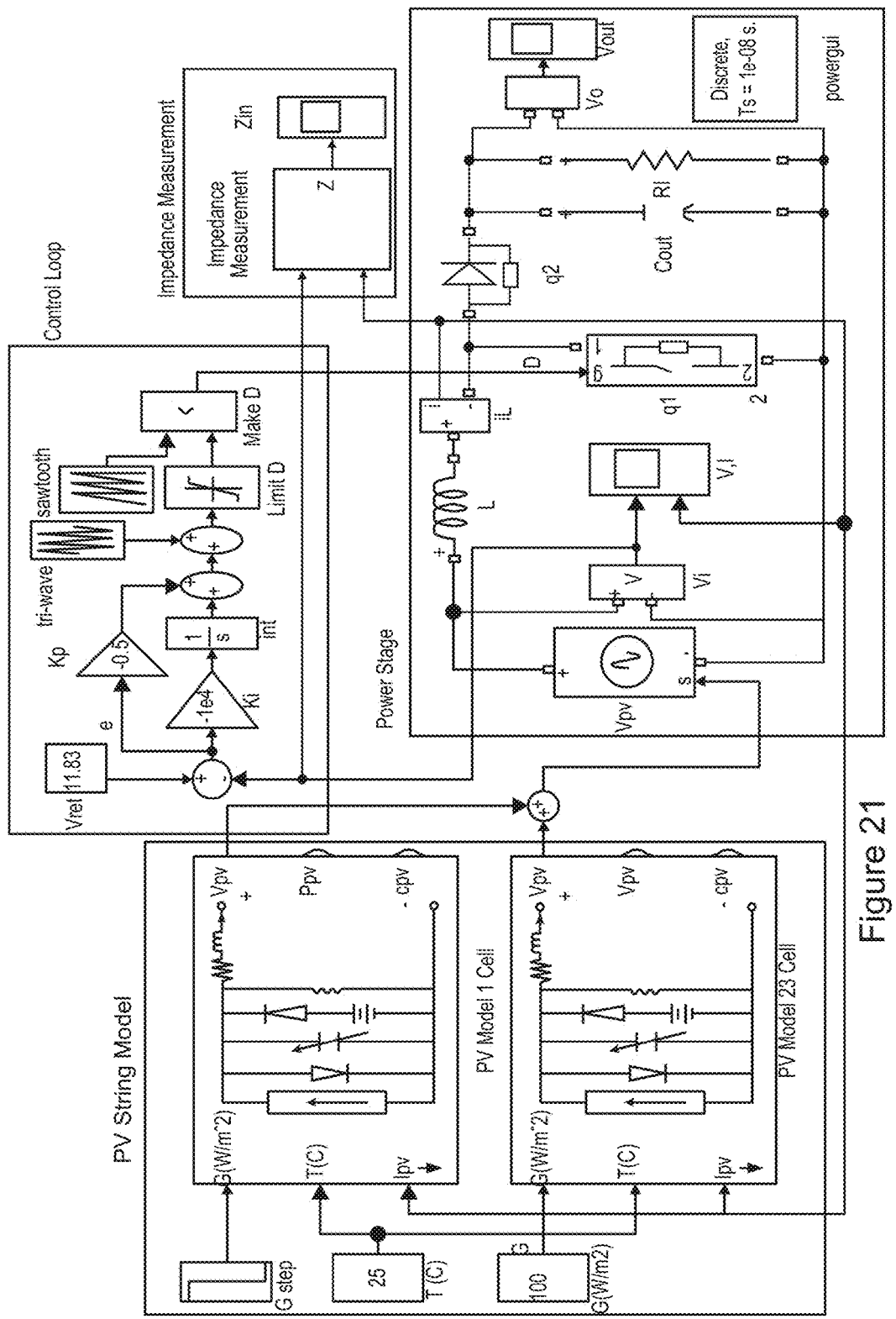
FIG. 21 is an exemplary circuit diagram of a PV string, boost converter power stage, control loop and impedance measurement.

FIG. 21 is an exemplary circuit diagram of a PV string, boost converter power stage, control loop and impedance measurement. A simulation is set up in Matlab Simulink using the SimPowerSystem toolbox. The simulation is conducted for 24 cells in series, where one cell in the string can be shaded. The boost converter utilized components from the SimPowerSystem toolbox; the components were assumed to be ideal for simplicity. During normal operation, the control loop used proportional-integral feedback to maintain constant voltage. The control loop can be implemented in a digital control loop using the DSP to set the proper converter duty ratio based on the measured PV voltage or as an analog control loop, as in the simulation in FIG. 21. The MPPT algorithm is fractional open-circuit voltage control, so the desired voltage is already determined. When the impedance measurement is made, the proportional-integral feedback loop is disabled and the controller briefly works in open-loop. A perturbation in the duty is created around the final duty ratio used in the feedback loop. The magnitude of the perturbation waveform in the current and voltage measurements of the PV string is used to properly measure the impedance.

The impedance measurement procedure is established. The current waveform of the PV string is the same as the inductor current of the boost converter. The inductor waveform under continuous conduction mode (CCM) is a known triangle waveform, where the mean value represents the average current value. For the impedance measurement, the average current and voltage signal is measured, e.g., the ripple at the converter frequency is filtered out. One approach to measuring the average signal is to oversample the waveform and calculate the average based on a moving window. Then, the maximum and minimum values of the averaged voltage and current waveforms can be determined and the impedance calculated based on (17).

Figure 22:
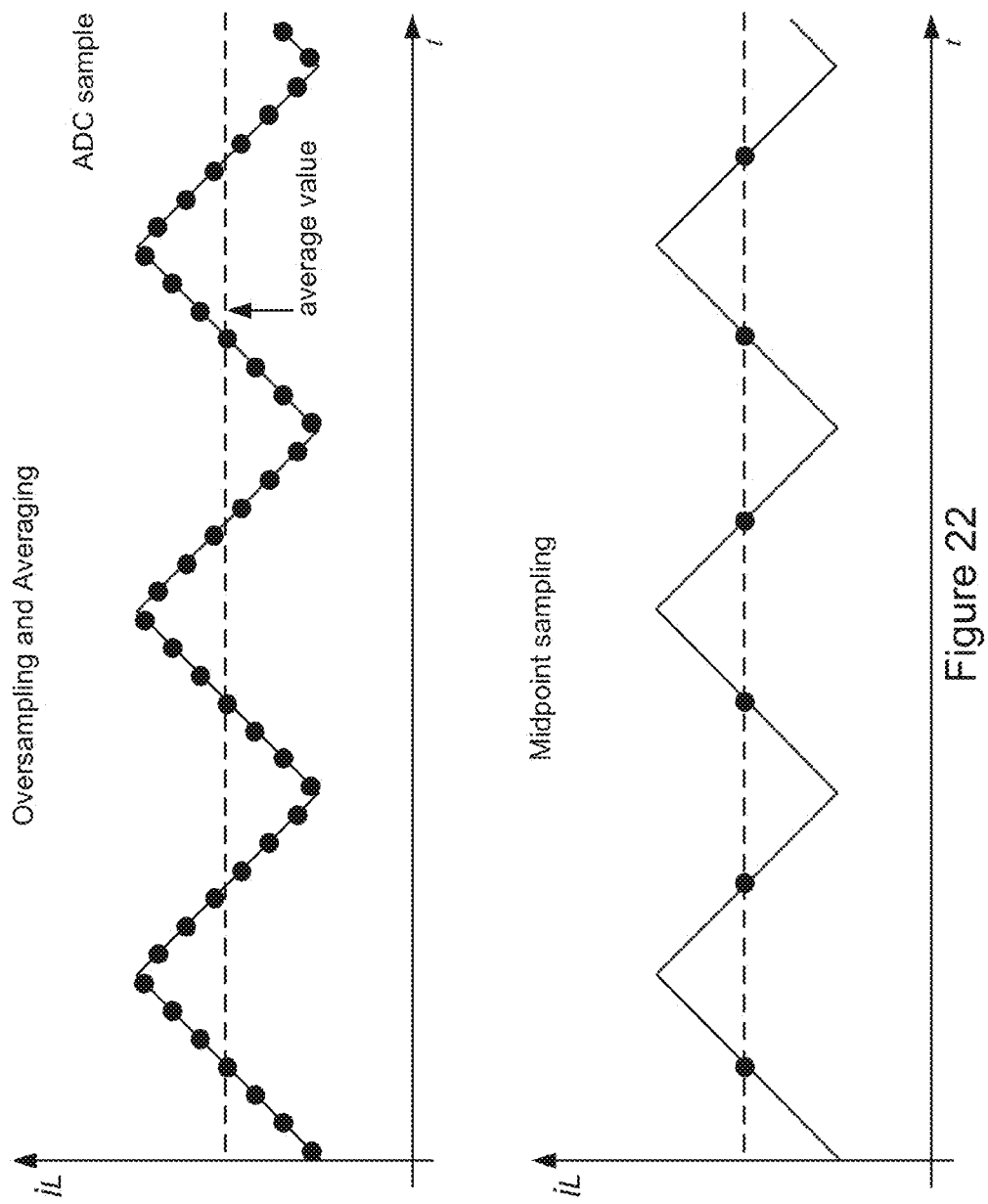
FIG. 22 is an exemplary diagram of the inductor current waveform and how it can be sampled by the ADC using either the previously-described oversampling and averaging method or the mid-point sampling method.

FIG. 22 is an exemplary diagram of the inductor current waveform and how it can be sampled by the ADC using either the previously-described oversampling and averaging method or the mid-point sampling method. The midpoint sampling is also measures the average waveform, but without oversampling. This method requires only one ADC measurement per switching cycle, which significantly reduces power consumption compared to over-sampling.

Figure 23:
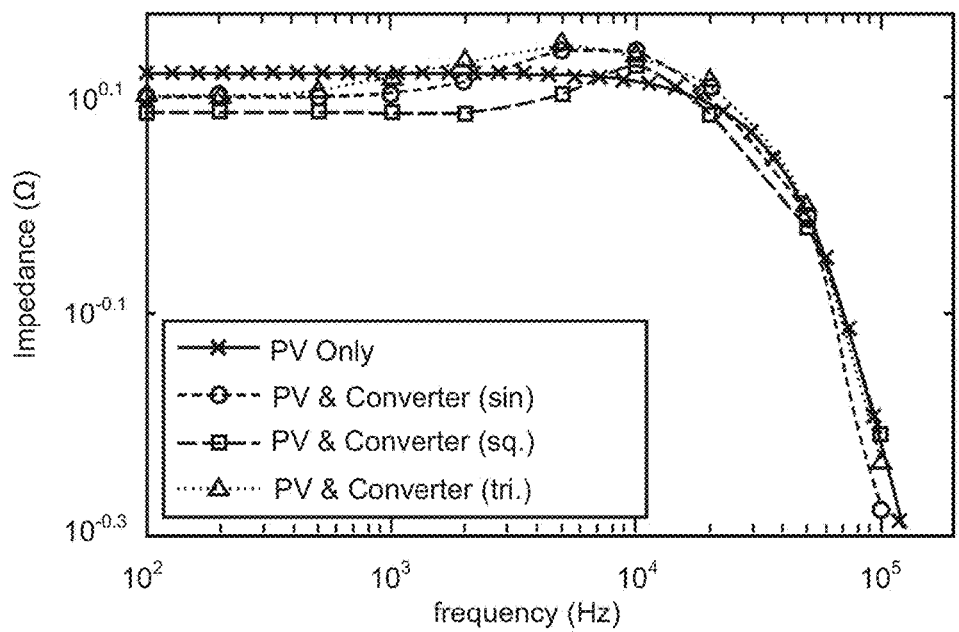
FIG. 23 is a graph of an exemplary impedance magnitude measured for the PV model and boost converter, comparing perturbation waveform shapes.

FIG. 23 is a graph of an exemplary impedance magnitude measured for the PV model and boost converter, comparing perturbation waveform shapes. The perturbation waveform is superimposed onto the last duty ratio value determined by the MPPT algorithm. Then, the duty ratio value is compared to a sawtooth waveform to produce the PWM signal, as shown in the control loop in FIG. 21. Ideally, a pure sine wave is used to measure impedance, but it is typically not possible for the dc-dc converter and digital controller to generate a perfect sine wave. A square wave is easy for the digital controller to create and to measure impedance values for PV cells. A triangle wave is also relatively easy for the digital controller to generate. The amplitude of the perturbation wave can also be determined. The calculation can be inaccurate due to noise if the amplitude is too small or it may cause power loss if it is too large.

First the PV model impedance is measured in simulation (without the boost converter) using a pure sine wave, which is assumed to be the correct impedance value. Then, the PV string and converter system is simulated with a sine, square, and triangle wave perturbation signal. Empirically, it is determined that an amplitude in the duty ratio of 0.05 (0.10 peak-to-peak) is appropriate for the impedance measurement in this system. These three perturbation waveform shapes were compared over a range of 100 Hz to 100 kHz in simulation and results are shown in FIG. 23. All three waveforms follow the general shape of the impedance curve, but with some error. The total error for each waveform is calculated as 4.7% for the sine wave, 5.6% for the square wave, and 4.1% for the triangle wave. The triangle wave is chosen as the perturbation waveform shape used to measure impedance because it has low error and is relatively easy to implement with digital control.

Figure 24:
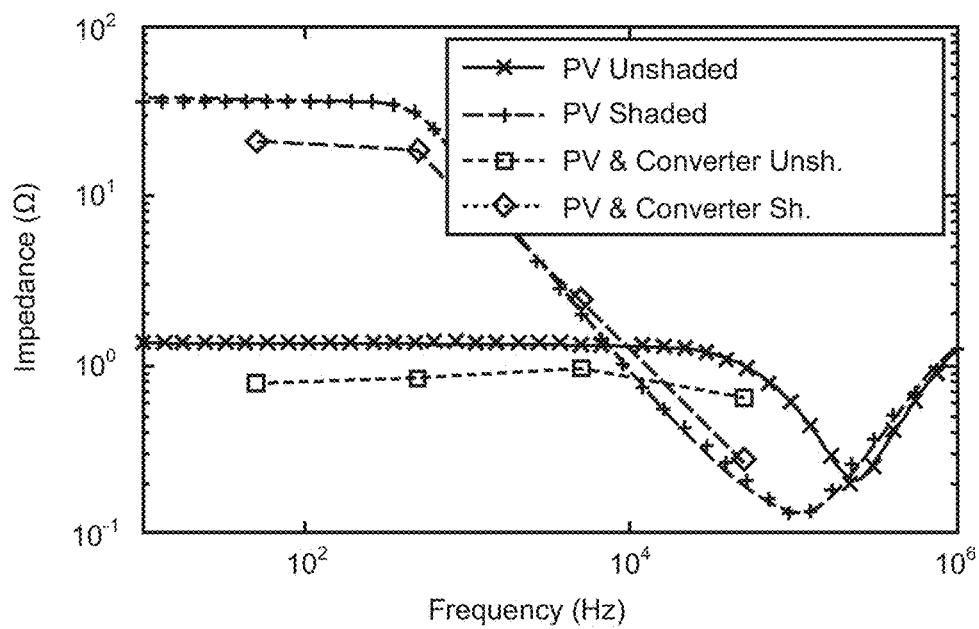
FIG. 24 is a graph of an exemplary impedance magnitude measured for the unshaded and partially shaded case.

FIG. 24 is a graph of an exemplary impedance magnitude measured for the unshaded and partially shaded case. Using the triangle wave as the perturbation waveform, a simulation is conducted to compare the PV string of 24 cells when it is unshaded (all at 1000 W/m$^2$) and partially shaded (one cell at 200 W/m$^2$). First, the PV model is measured with a pure sine wave and then it is measured again with the boost converter. The results are shown in FIG. 24 with boost converter measurements ranging from 50 Hz to 50 kHz. The converter measurements follow the shape of the impedance magnitude; enough to determine that there is a distinct change between the shaded and unshaded case. These simulation results indicate that the control and impedance measurement method can measure the impedance of a PV string accurately enough such that a clear change in parallel resistance and parallel capacitance is detected.

The frequency values used to measure the impedance can span the low-frequency and mid-frequency range in order to measure the parallel resistance and parallel capacitance range. Measurements at 50 Hz and 50 kHz were used to detect hot spotting. Based on the simulation results, these frequencies (or frequencies in a similar range) are sufficient to accurately measure the parallel resistance and capacitance values when the string is under both normal and hot spotting conditions. Additional frequency measurements can be added if the two measurements are found to be insufficient to detect hot spotting based on an implementation.

Figure 25:
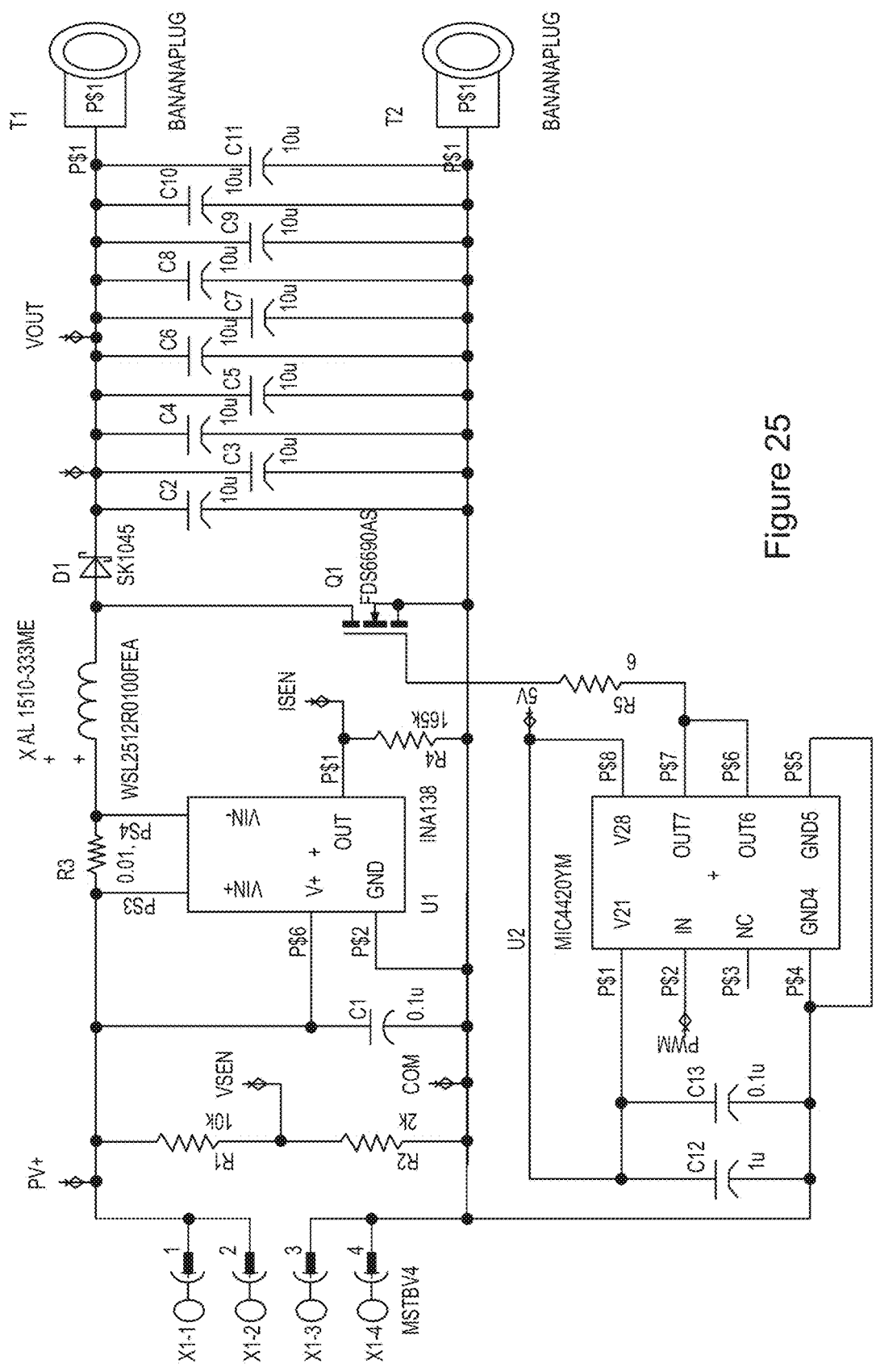
FIG. 25 is a circuit diagram of an exemplary power stage of the boost converter hardware.
Figure 26:
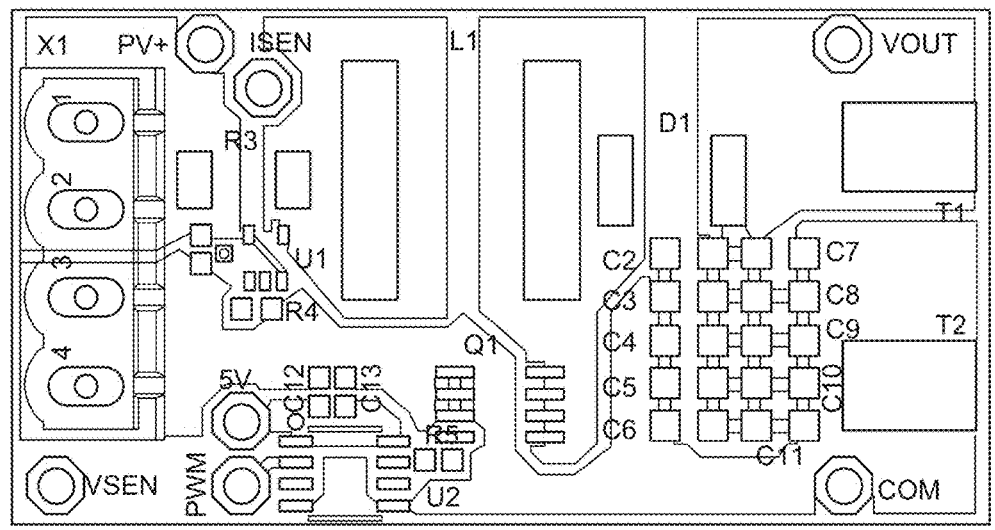
FIG. 26(a) and FIG. 26(b) illustrate an exemplary board front and back respectively of FIG. 26.
Figure 26:
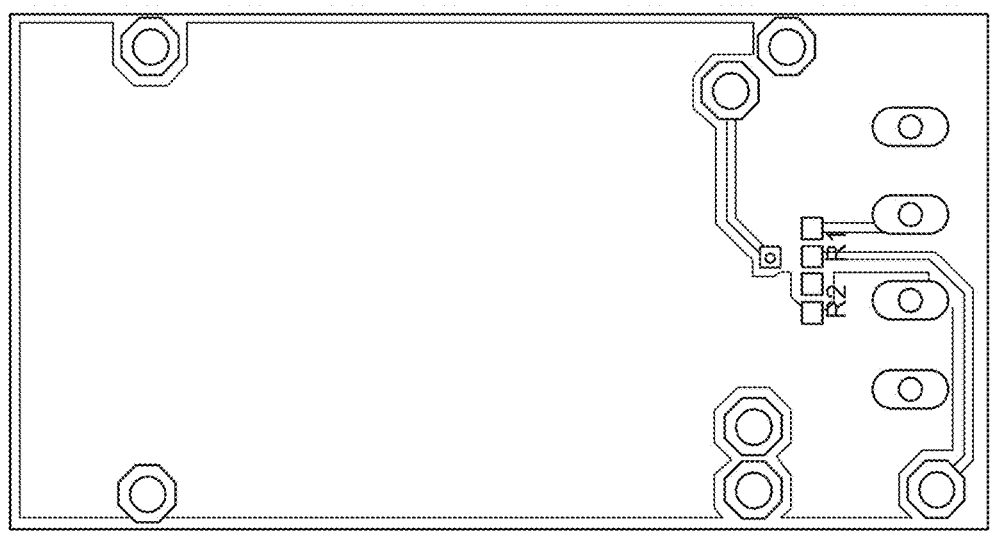

FIG. 25 is a circuit diagram of an exemplary power stage of the boost converter hardware. The TMS320F28335 Experimenter Kit is used to program the DSP used as the controller. The power stage, sensors, and drivers are implemented on a separate board. Input signals are connected between the two boards. The schematic for the boost converter, sensors, and drivers is shown in FIG. 25 and an exemplary board front and back are shown in FIG. 26(a) and FIG. 26(b), respectively. The PV string input can be connected at the input connector X1. The basic boost topology includes the inductor L1, active MOSFET switch Q1, and the passive Schottky diode D1. The output stage includes many ceramic capacitors connected in parallel to form a larger output capacitance; T1 and T2 connect to the output load. The active switch Q1 is driven by a low-side FET driver including U2 and the adjacent components. Input voltage sensing can be achieved using a voltage divider R1 and R2. Input current sensing is achieved using a current sense amplifier U1. Connections VSEN and ISEN are input into the DSP controller and the DSP output goes to the PWM connector.

Therefore, hot spots can be detected using measurements of the PV string's ac small-signal characteristics. Hot spotting conditions can be detected based on a distinct change in the PV parallel resistance and capacitance when the string is under MPPT. Impedance measurements at determined frequency values can provide for a low-cost solution. Additionally or alternatively, parameter estimations can be used. The boost converter is designed that is able to measure PV impedance during regular MPPT operation. A triangle wave is used as the perturbation waveform to calculate the impedance. Two measurements at a low frequency (50 Hz) and a high frequency (50 kHz) are shown to be sufficient to observe the change in impedance. Once the hot spot is detected, the next step is to protect the PV string where the hot spot is occurring against damage.

Figure 27:
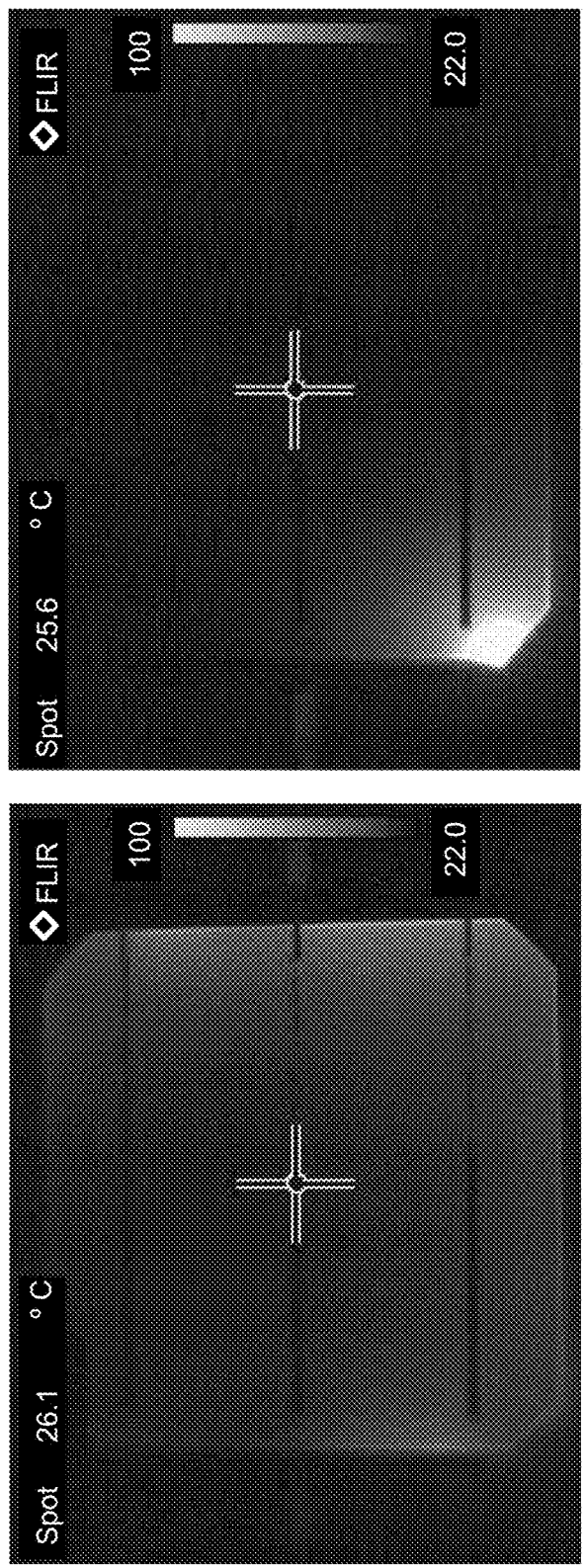
FIG. 27 is a block diagram illustrating heating throughout a cell due to (a) reverse biasing and (b) localized heating due to second breakdown.

FIG. 27 is a block diagram illustrating heating throughout a cell due to (a) reverse biasing and (b) localized heating due to second breakdown. Once a hot spot or arc fault is detected, the system can react to protect the system from damage. The effects of reverse bias and hot spotting on PV cells is determined to identify a 'safe' threshold for cells under reverse voltage bias. The protection device can replace or be used in addition to the bypass diode and protect against hot spotting. Additionally, the protection device along with bypass circuitry can be integrated into DPP converters. When a PV cell becomes reverse biased past a certain voltage, the cell begins to breakdown, allowing more current to flow. The two main breakdown mechanisms in the p-n junction are zener and avalanche breakdown, which are both affected by temperature. Ideally, current flows through the entire cell such that heat is dissipated evenly. However, second breakdown can occur, which localizes the current flow around a dislocation or impurity in the cell. Because the current is concentrated to a small area, the internal heating causes the temperature in that localized region to increase significantly. High temperatures can degrade the material at these breakdown regions such that they become a permanent weak spot in the cell.

In FIG. 27 infrared images for two cells were both reverse biased up to 4×MPP. Current flow and internal heating are distributed throughout the cell in FIG. 27(a), which did not go into second breakdown; the temperature generally stays evenly distributed and well below 100° C. In contrast, the cell shown in FIG. 27(b) shows second breakdown resulting in temperatures above 100° C. at the bottom left corner of the cell. Among the four test power levels on the m-c cells, second breakdown occurred on two of three cells tested at 3×MPP and two of three tested at 4×MPP. When second breakdown occurred, localized heating can drastically alter the I-V curve during hot spotting and the I-V characteristics were more likely to permanently change. Less than 2×MPP power in reverse bias can be a safe operating region where second breakdown and localized heating is less likely to occur.

Figure 28:
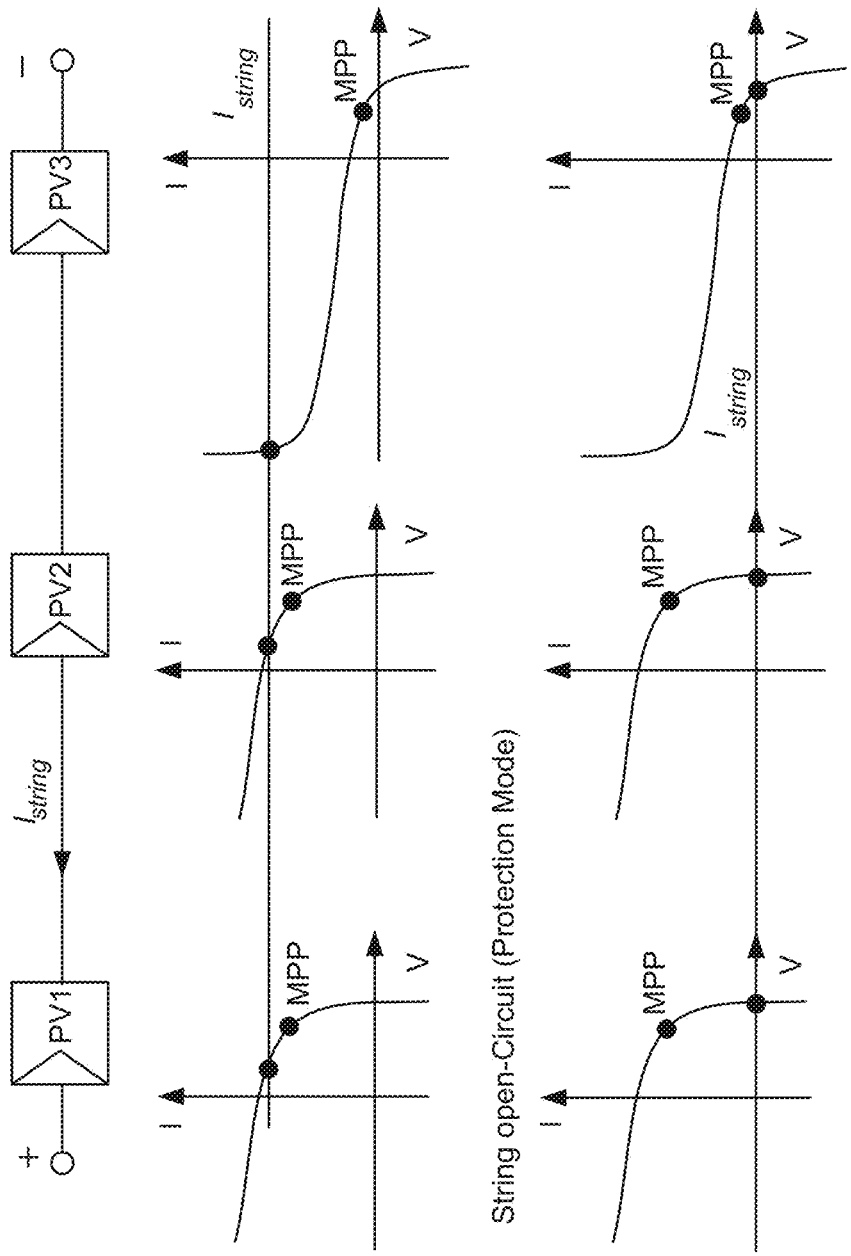
FIG. 28 is a block diagram illustrating exemplary operating points of a partially shaded string under short-circuit and open-circuit conditions.

FIG. 28 is a block diagram illustrating exemplary operating points of a partially shaded string under short-circuit and open-circuit conditions. Hot spotting can occur due to partial shading when the string is under short-circuited or bypassed. For hot spot protection, open-circuiting the substring that contains the mismatched cell is guaranteed to prevent hot spotting, because no current or power will flow through any cell in that substring. For example, the mismatched PV3 cell dissipates heat under short-circuit but dissipates no power under open-circuit.

Figure 29:
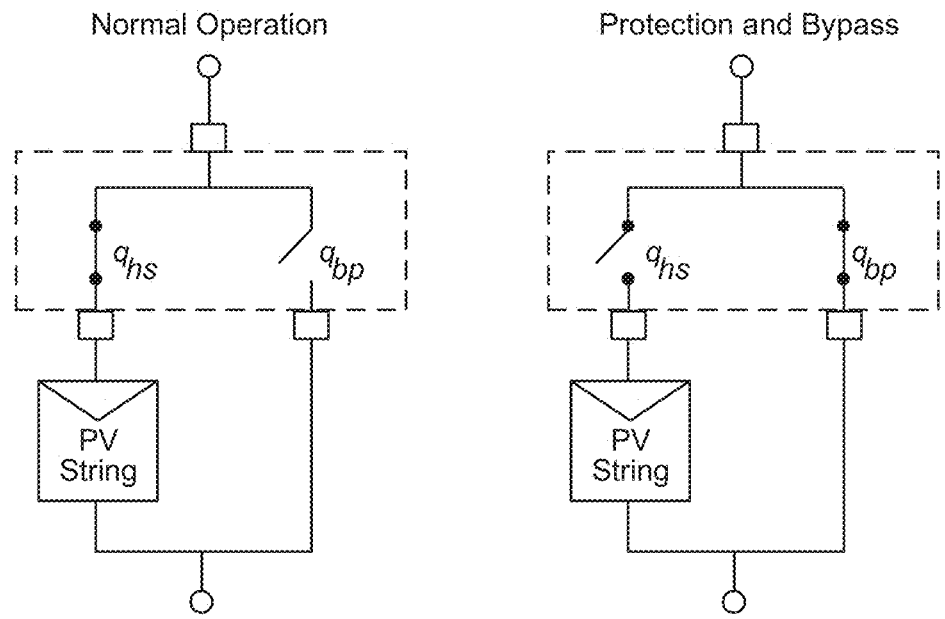
FIGS. 29a-d are circuit diagrams of exemplary protection devices in normal operation mode and hot spot protection and bypass mode illustrating (a) ideal switches, (b) functional switch symbols, (c) implementation with BJT and MOSFET switches, and (d) implementation with MOSFET switches.
Figure 29:
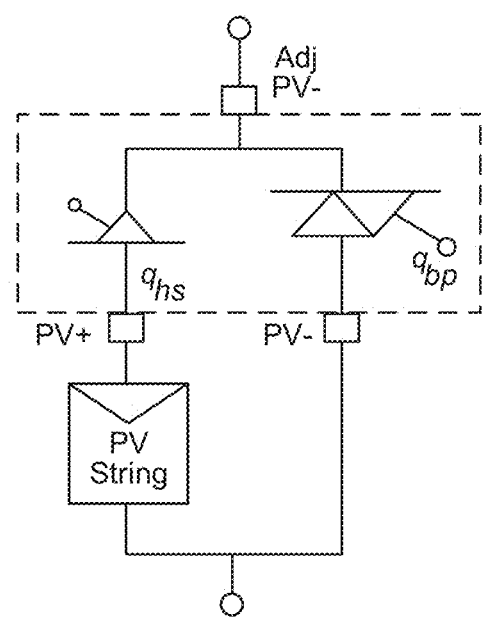
Figure 29:
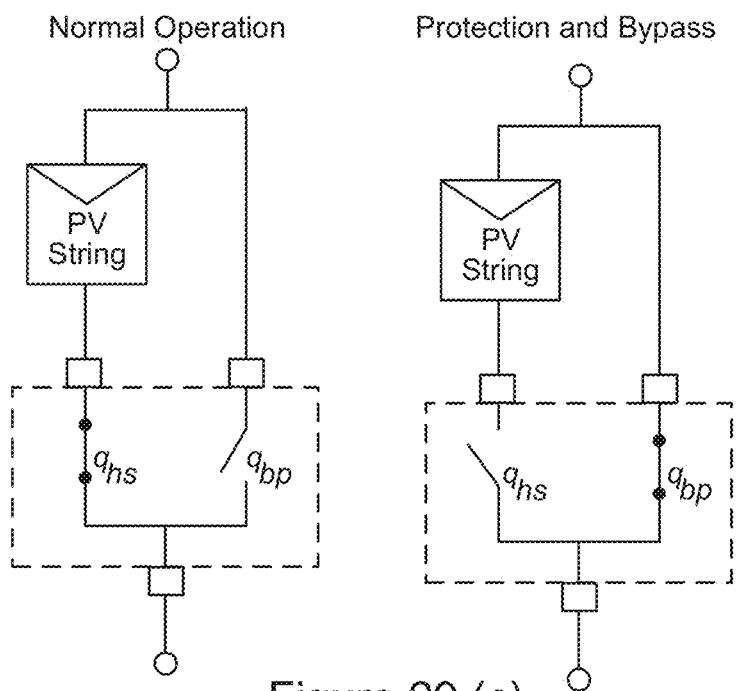
Figure 29:
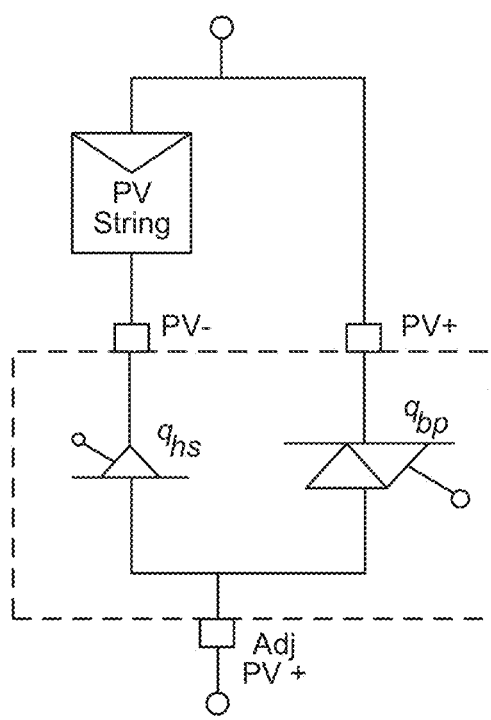
Figure 30:
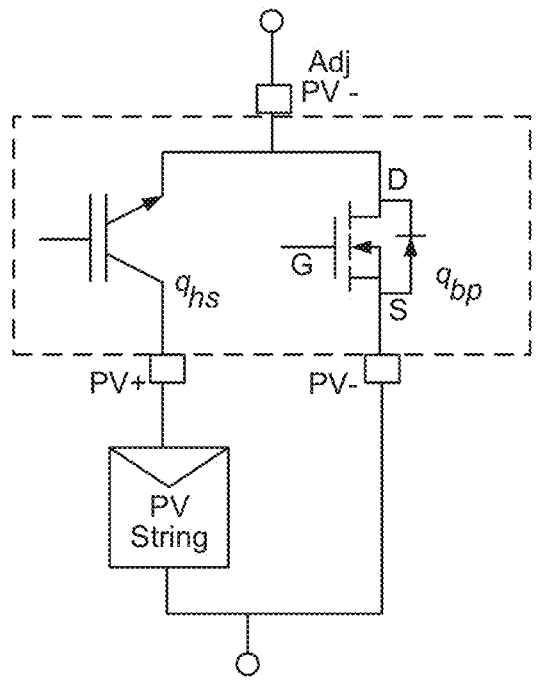
FIGS. 30a-d shows a variety of potential switch implementations for the protection device.
Figure 30:
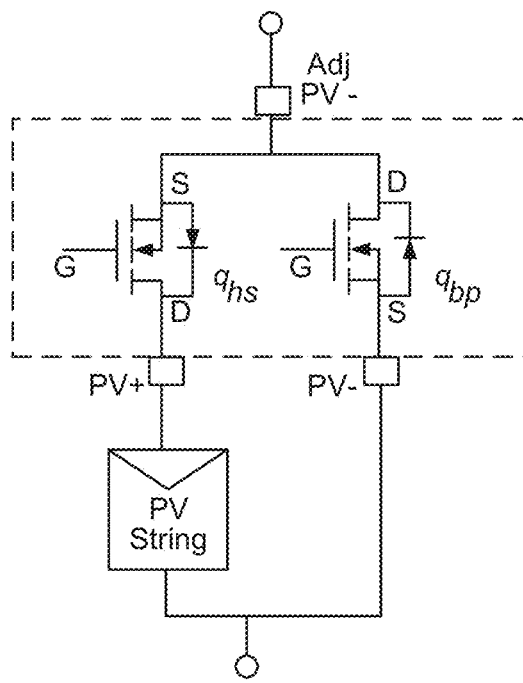
Figure 30:
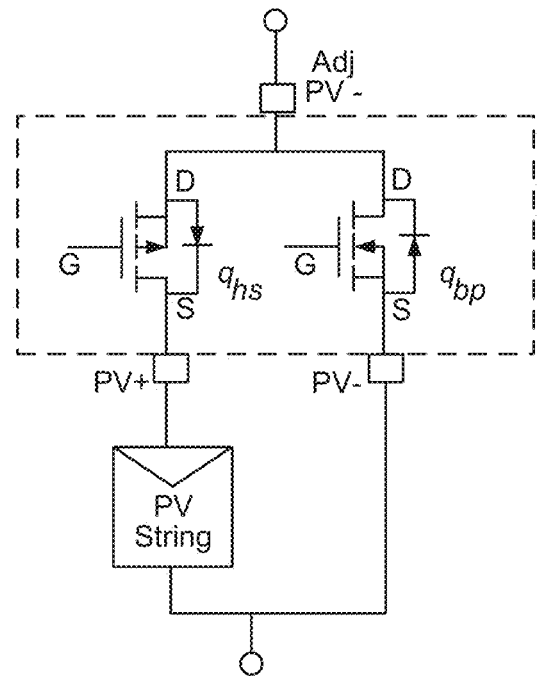
Figure 30:
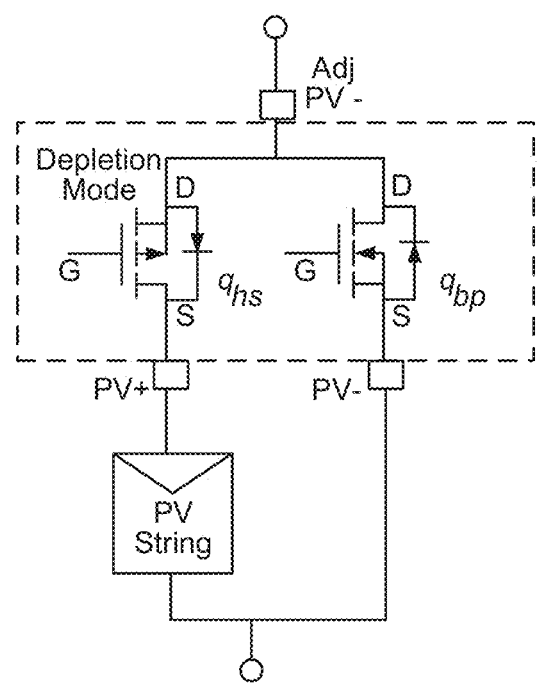

FIGS. 29a-d are circuit diagrams of exemplary protection devices in normal operation mode and hot spot protection and bypass mode illustrating (a) ideal switches and (b) functional switch symbols for a protection device designed to connect above the PV string and the same diagrams for a protection device below the PV string. Either placement of the protection device results in the hot spot prevention and bypass functionality. When a substring is bypassed, it produces no net output power. Since the substring contribution is zero in such an event, the open-circuit string protects it from hot spotting. This protection method can be implemented using the set of two switches in FIG. 29(a) or FIG. 29(c). Switch $q_{hs}$ is in series with the PV string and is normally on; it opens when a hot spot condition is detected to prevent further hot spotting. Switch $q_{bp}$ is in parallel with the PV substring and is normally open; while the string is open-circuited, it turns on to allow a bypass current path. For the device to operate properly, the switches can carry and block current in the proper directions. FIG. 29(b) and FIG. 29(d) show the switches with the correct current flow directions and blocking characteristics for the protection device above or below the PV string, respectively. To follow these switch characteristics, the protection device can be implemented with the use of bipolar junction transistors (BJT), MOSFETs, mechanical relays, or solid-state relays. for $q_{bp}$, as in FIG. 29(c).

FIGS. 30a-d shows a variety of potential switch implementations for the protection device. The hot spot prevention switch $q_{hs}$ can be implemented with a BJT and the bypass switch $q_{bp}$ with an enhancement-mode n-channel MOSFET as in FIG. 30(a). Alternatively, the $q_{hs}$ BJT can be directly replaced with an enhancement-mode n-channel MOSFET such that its blocking characteristics are the same, as in FIG. 30(b). Alternatively, an enhancement-mode p-channel MOSFET can be used as the $q_{hs}$ switch, as in Figure X30c). Further, a depletion mode MOSFET can also be used as the $q_{hs}$ switch, as in FIG. 30(d), which allows the device to function in normal operation mode even if there is no power to the device and driver, for example, if a failure were to occur in the device. The implementations shown are for the device above the PV string, but switch implementations are analogous for the device designed to go below the PV string. Switches such as mechanical or solid-state relays can also be used to implement the hot spot prevention device. Two enhancement-mode n-channel MOSFETs are used as the switches for the first prototype because these MOSFETs are inexpensive and more readily available.

Figure 31:
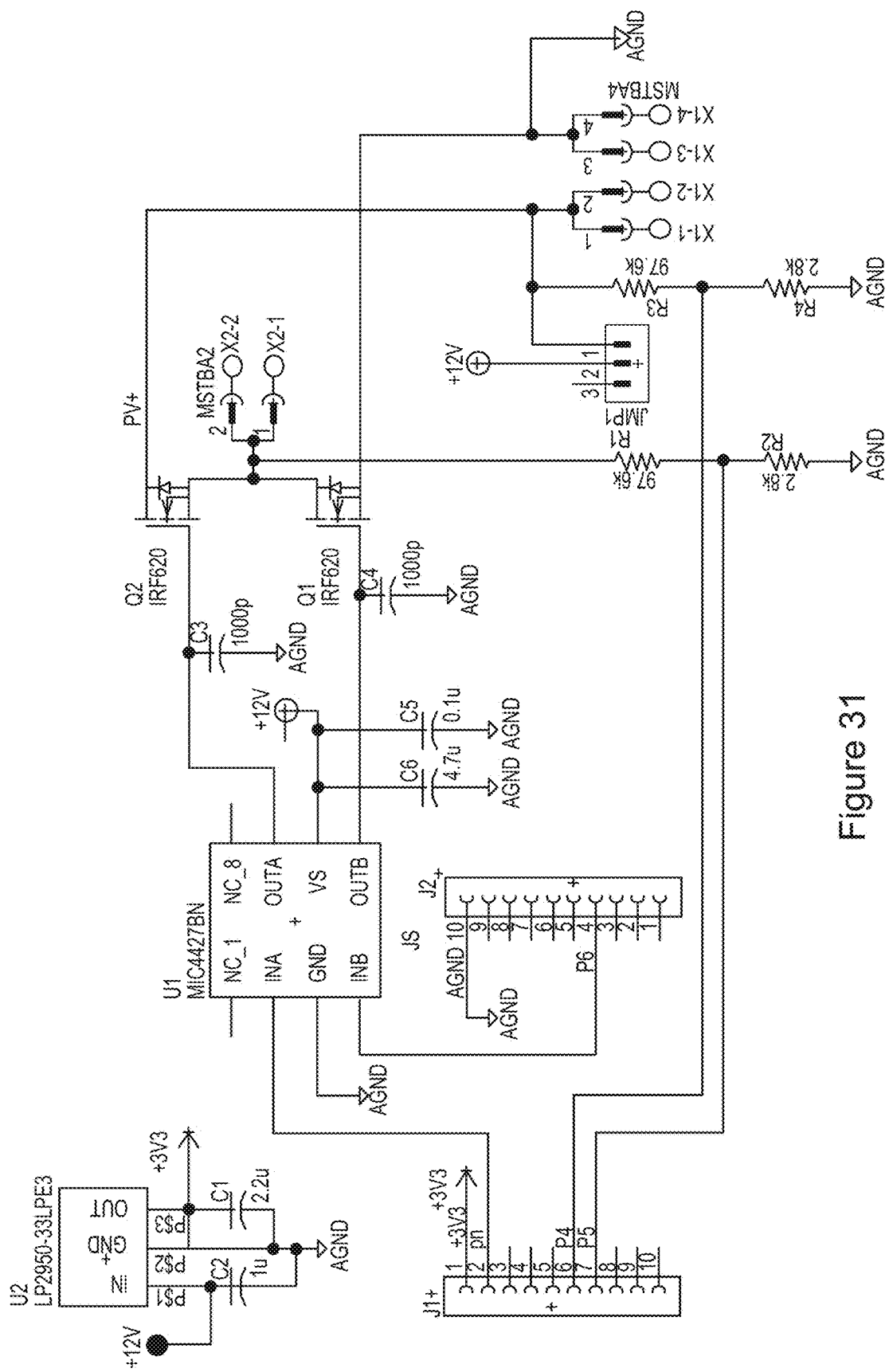
FIG. 31 is a circuit diagram of an exemplary hot spot prevention schematic.
Figure 32:
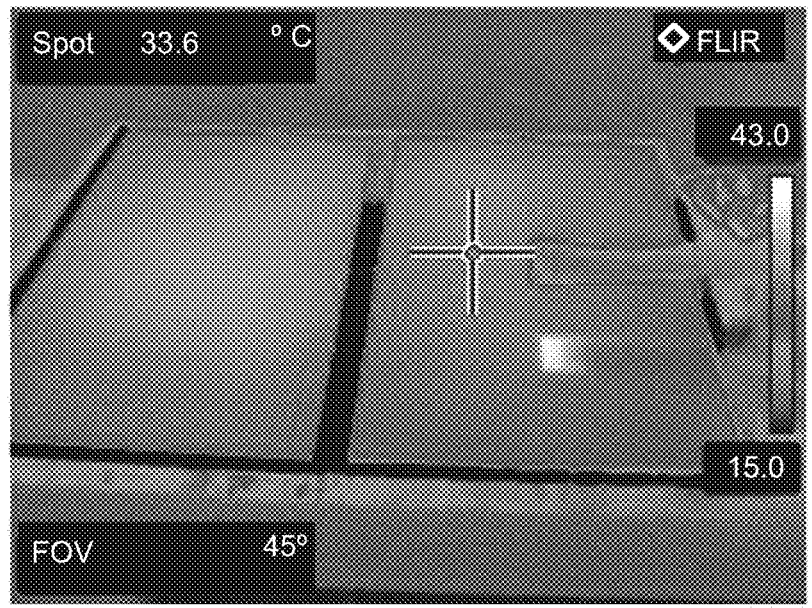
FIG. 32 illustrates infrared images of PV strings under partial shading with (a) bypass diode and (b) the hot spot protection device.
Figure 32:
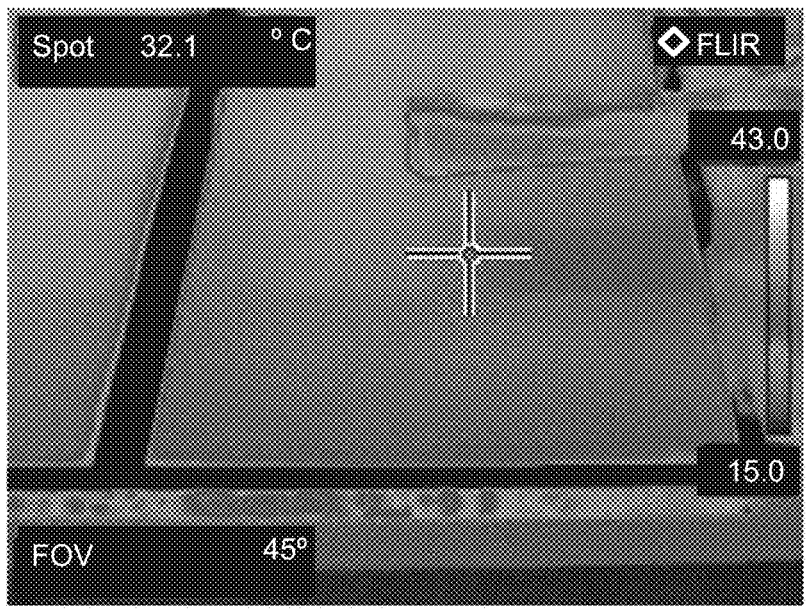

FIG. 31 is a circuit diagram of an exemplary hot spot prevention schematic. The hot spot prevention circuit uses two enhancement-mode n-channel MOSFET switches and be powered off of the PV panel. The PV+ and PV− terminals of the PV context to X1 and provide power through a jumper JMP1 to power a linear regulator U2 the provide logic-level power to the microcontroller. The microcontroller connects to the protection device board through header pins J1 and J2. A low-side driver chip U1 takes input signals from the microcontroller and drives the bypass switch Q1 and the hot spot prevention switch Q2. The negative terminal of the adjacent PV connects to X2. Voltage dividers comprised of resistors R1-R4 send voltage measurements back to the microcontroller. Although a low-side MOSFET driver can work in certain conditions, a high-side driver can be used to consistently drive the high-side switch Q2. The hot spot prevention device is tested in an experimental setup with a resistive load powered by two 20-cell PV strings, where one cell is partially shaded on a clear sunny day. First, an active bypass switch is used across the shaded string. The illuminated portion of the partially-shaded cell raised in temperature, as shown in the infrared image in FIG. 32(a). In the test, the condition is not adjusted for worst case to avoid driving the cell to failure. The hot spot temperature stabilized after a few minutes and then the hot spot prevention device is activated. When prevention is activated, the temperature dropped immediately. After approximately 20 seconds the hot spot temperature reduced to the temperature of the surrounding cells, as shown in FIG. 32(b).

Figure 33:
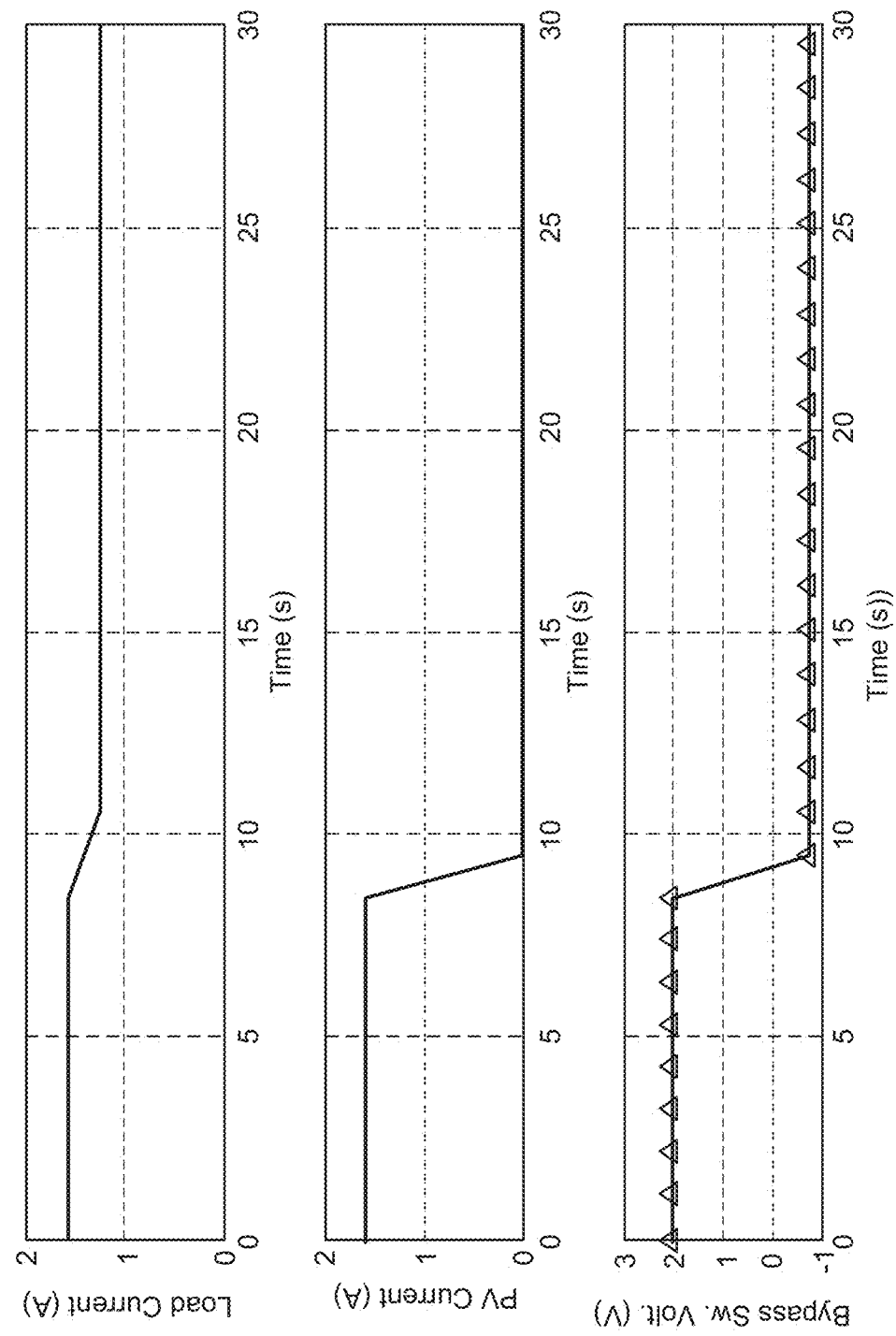
FIG. 33 is a graph illustrating load current, PV current, and bypass switch voltage before and after open-circuit protections is activated.

The load current, current through the partially shaded PV, and voltage over the bypass switch are shown in FIG. 33, where the protection device is activated at 8 seconds. Current still flows through the load, showing that that hot spotting cell is bypassed and the unshaded PV string is powering the load. The PV current drops to zero after the protection mode is activated, and the voltage over the bypass switch becomes negative because the switch begins to conduct current. The MOSFET had a relatively large on-resistance of 0.54Ω. Other implementations can use switches with a lower on-resistance to reduce power loss. These results show that localized hot spotting is possible under bypass and that open-circuiting the PV substring using the protection device prevents hot spotting.

Figure 34:
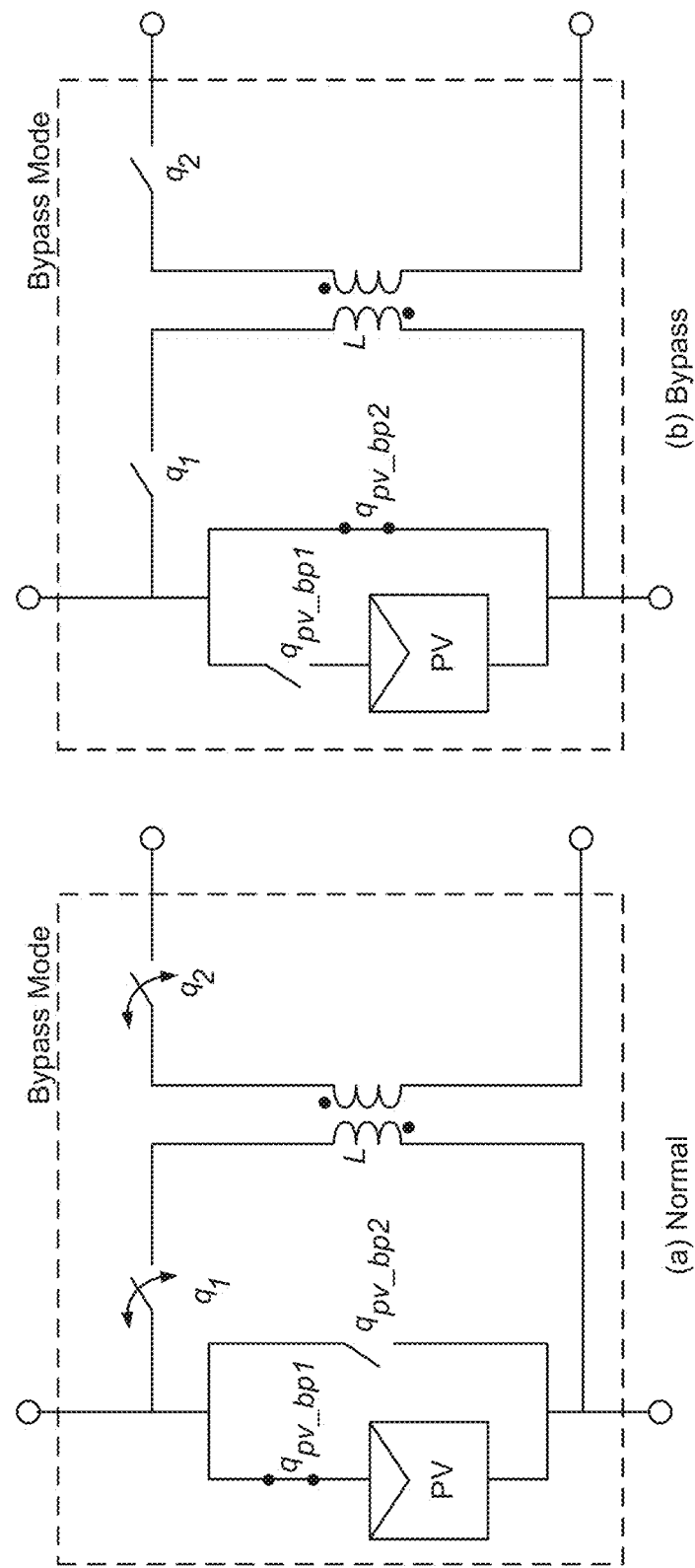
FIG. 34 is a circuit diagram of an exemplary PV-to-bus topology operation for (a) normal and (b) bypass mode.

FIG. 34 is a circuit diagram of an exemplary PV-to-bus DPP topology operation for (a) normal and (b) bypass mode. The PV protection device can be integrated into DPP converters and synchronized with a bypass mode for the DPP converter. The topology and operation modes for the PV-to-bus DPP converter are in FIG. 34. The coupling inductor L can connect the PV string to a power bus. Compared to the topology discussed above, two PV protection switches are added: $q_{pv\_bp1}$ and $q_{pv\_bp2}$. When bypass mode is activated, $q_{vp\_bp2}$ closes to allow a bypass current path, $q_{vp\_bp1}$ opens to prevent hot spotting, and the converter switches $q_1$ and $q_2$ are opened to turn off the DPP converter while maintaining the integrity of the system architecture.

Figure 35:
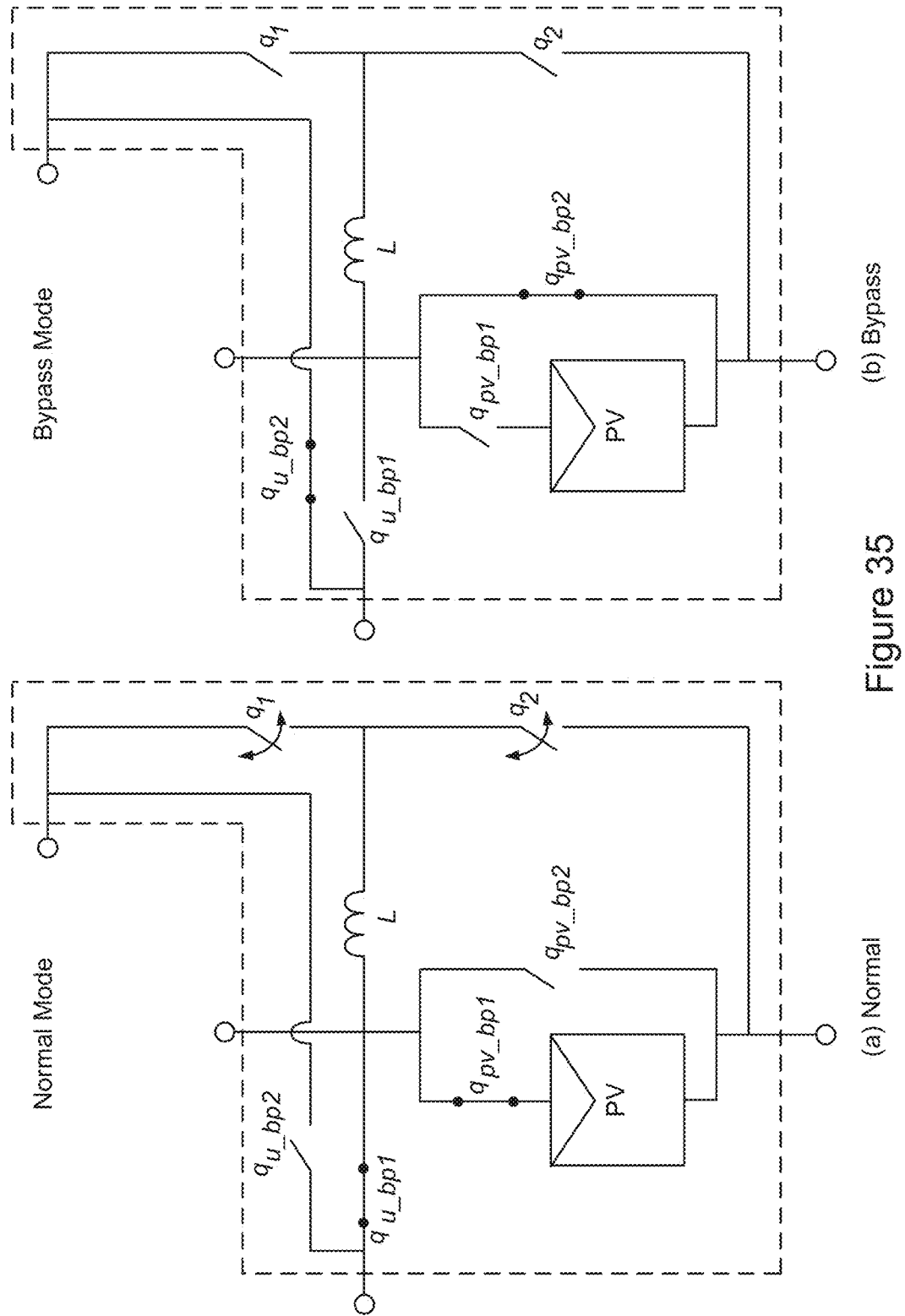
FIG. 35 is a circuit diagram of an exemplary PV-to-PV topology operation for (a) normal and (b) bypass mode.

FIG. 35 is a circuit diagram of an exemplary PV-to-PV topology operation for (a) normal and (b) bypass mode. The topology and operation modes for the PV-to-PV DPP converter are in FIG. 35. The normal topology for the PV-to-PV DPP converter includes inductor L and switches $q_1$ and $q_2$, which are all used together to process power. This topology that includes bypass capability utilizes four switches compared to the normal topology. The $q_{up\_bp1}$ and $q_{up\_bp2}$ switches are used to maintain the integrity of the PV-to-PV converter architecture when a PV DPP and PV string unit is bypassed. When bypass mode is activated, $q_{pv\_bp2}$ closes and $q_{pv\_bp1}$ opens, the converter switches q1 and q2 are opened, and $q_{u\_bp2}$ closes and $q_{u\_bp1}$ opens to connect the above DPP converter to the converter.

Therefore, at least two methods to prevent hot spotting were discussed: ensure that the cell can fully dissipate the worst-case power scenario without damaging the cell or open-circuit the PV string. Cells with low reverse breakdown voltages limit the power dissipated but a lower-magnitude reverse breakdown level may be required to effectively prevent hot spot damage. A panel-level control strategy that limits the string operation above a certain voltage is a hot spot prevention method that can be implemented for Type A or typical Type B PV cells without any additional hardware. Alternatively, active hot spot prevention using open-circuit protection guarantees that hot spotting does not occur. The two switch device is reliable and adds both hot spot prevention and arc-fault extinguishment functionality to PV systems at the panel or subpanel level.

Another aspect of the systems and methods is that previously it has been difficult to provide power for protection circuits, since by function they are intended to "turn off" local PV cells and substrings in some sense. The system and methods, by open-circuiting local PV substrings, can extract energy for operation from the limited remaining functionality and from surrounding PV devices.

The device includes a sequential open-circuit functionality and has fault sensing procedure added to established bypass functionality. The systems and methods can resolve issues that drive hot spots and can react to arc faults, bypassed to allow current to flow in the remainder of the system, and opened locally to prevent reverse flow. This active switching device can make the process reversible. If the problem condition is corrected or otherwise goes away, normal function can be restored without human intervention.

Features of the systems and methods include bypass power flow functionality around a string of photovoltaic cells, while also quenching arc faults and protecting the string from forming hot spots. The systems and methods prevents known hot-spot situations. A benefit includes that photovoltaic panels can last longer and produce more total power over their lifetime because they do not experience accelerated degradation. PV reliability can improve because hot spotting is prevented and arc faults are corrected. Structural fires related to arc faults and hot spots can be avoided.

The systems, methods, devices, and logic described above may be implemented in many different ways in many different combinations of hardware, software or both hardware and software. For example, all or parts of the system may include circuitry in a controller, a microprocessor, or an application specified integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

Many modifications and other embodiments set forth herein can come to mind to one skilled in the art having the benefit of the teachings presented in the foregoing descriptions and the associated drawings. Although specified terms are employed herein, they are used in a generic and descriptive sense only and not for purposes of limitation.

The invention claimed is:

1. A circuit for protecting a photovoltaic string, comprising:
    a bypass switch connected in parallel to the photovoltaic string;
    a hot spot protection switch connected in series with the photovoltaic string;
    a first control signal to control opening and closing of the bypass switch, where the bypass switch is normally open, and the first control signal closes the bypass switch upon detection of a determined condition at a photovoltaic cell while the hot spot protection switch is closed to allow current to flow through the photovoltaic string and to bypass the photovoltaic cell to halt and protect against an arc fault; and
    a second control signal to control opening and closing of the hot spot protection switch, where the hot spot protection switch is normally closed, and the second control signal opens the hot spot protection switch after a delay after the bypass switch closes to prevent current flowing from the photovoltaic string from causing hot spotting to the photovoltaic cell.

2. The circuit of claim 1, further comprising a converter bypass switch connected between a power bus and the photovoltaic string, where a converter connected with the photovoltaic string is bypassed when the converter bypass switch is closed.

3. The circuit of claim 1, further comprising a differential power processing (DPP) unit bypass switch connected between converter and photovoltaic string units, where one of the converter and photovoltaic string units is bypassed when the unit bypass switch is closed.

4. The circuit of claim 1, where the hot spot condition is detected when a photovoltaic positive voltage goes negative.

5. The circuit of claim 1, where the hot spot condition is detected when a change in capacitance is detected.

6. The circuit of claim 5, where the capacitance comprises photovoltaic (PV) junction capacitance.

7. The circuit of claim 1, where the hot spot condition is detected when a change in impedance is detected.

8. The circuit of claim 7, where the change is impedance comprises a change in magnitude or phase for a determined frequency range.

9. The circuit of claim 7, where a magnitude of a perturbation waveform in current and voltage measurements of the photovoltaic string is used to measure the impedance.

10. The circuit of claim 1, where a hot spot condition is detected when at least one of a capacitance increases and an impedance magnitude decreases over determined frequencies for a photovoltaic string.

11. A circuit for protecting a photovoltaic string, comprising:
    a hot spot detection circuit configured to detect at least one of a change in an impedance magnitude and capacitance of the photovoltaic string;
    a bypass switch connected with the hot spot detection circuit, the bypass switch also connected in parallel with the photovoltaic string, the bypass switch configured to close when the hot spot detection circuit detects a decrease in the impedance magnitude or an increase in capacitance to allow current to flow through the photovoltaic string and bypass a photovoltaic cell to halt and protect against an arc fault; and
    a hot spot protection switch connected in series with the photovoltaic string, the hot spot protection switch configured to open when the hot spot detection circuit detects a decrease in the impedance magnitude or an increase in capacitance, where the hot spot protection switch opens after a delay after the bypass switch closes to prevent current flowing from the photovoltaic string from causing hot spotting to the photovoltaic cell.

12. The circuit of claim 11, further comprising a converter bypass switch connected between a power bus and the photovoltaic string, where a converter connected with the photovoltaic string is bypassed when the hot spot detection circuit detects a decrease in the impedance magnitude or an increase in capacitance.

13. The circuit of claim 11, further comprising a unit bypass switch connected between converter and photovoltaic string units, where one of the converter and photovoltaic string units is bypassed when the hot spot detection circuit detects a decrease in the impedance magnitude or an increase in capacitance.

14. The circuit of claim 11, where the capacitance comprises photovoltaic (PV) junction capacitance.

15. The circuit of claim 11, where the bypass switch is further configured to close when the hot spot detection circuit detects a change in impedance phase for a determined frequency range.

16. A method for protecting a photovoltaic string, comprising:
    controlling with a first control signal opening and closing of a bypass switch connected in parallel with the photovoltaic string, to allow current to flow through the photovoltaic string and bypass a photovoltaic cell to halt and protect against an arc fault;
    controlling with a second control signal opening and closing of a hot spot protection switch, to prevent current flowing from the photovoltaic string from causing hot spotting to the photovoltaic cell; and
    detecting a hot spot condition, where the first control signal closes the bypass switch and after a delay after the bypass switch is closed the second control signal opens the hot spot protection switch when the hot spot condition is detected.

17. The method of claim 16, further comprising controlling with a third control signal a converter bypass switch connected between a power bus and the photovoltaic string, and bypassing a converter connected with the photovoltaic string when the hot spot condition is detected.

18. The method of claim 16, further comprising controlling with a fourth control signal a unit bypass switch connected between converter and photovoltaic string units, and bypassing one of the converter and photovoltaic string units when the hot spot condition is detected.

19. The method of claim 16, where a hot spot condition is detected when at least one of a capacitance increases and an impedance magnitude decreased over determined frequencies for a voltage operating range of the photovoltaic string.

* * * * *